(12) United States Patent
Yang et al.

(10) Patent No.: US 7,499,314 B2
(45) Date of Patent: Mar. 3, 2009

(54) REFERENCE CELL SCHEME FOR MRAM

(75) Inventors: Hsu Kai Yang, Pleasanton, CA (US); Po-Kang Wang, San Jose, CA (US); Xizeng Shi, Fremont, CA (US)

(73) Assignees: MagIC Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 12/002,161

(22) Filed: Dec. 14, 2007

(65) Prior Publication Data
US 2008/0094884 A1    Apr. 24, 2008

Related U.S. Application Data

(62) Division of application No. 11/284,299, filed on Nov. 21, 2005, now Pat. No. 7,321,507.

(51) Int. Cl.
G11C 11/00 (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,269,040 B1 | 7/2001 | Reohr et al. | |
| 6,426,907 B1 * | 7/2002 | Hoenigschmid | 365/158 |
| 6,643,213 B2 * | 11/2003 | Perner et al. | 365/230.06 |
| 6,697,294 B1 | 2/2004 | Qi et al. | |
| 6,711,068 B2 | 3/2004 | Subramanian et al. | |
| 6,754,123 B2 | 6/2004 | Perner et al. | |
| 6,791,887 B2 | 9/2004 | Hung et al. | |
| 6,791,890 B2 | 9/2004 | Ooishi | |
| 6,816,403 B1 | 11/2004 | Brennan et al. | |
| 6,845,037 B1 | 1/2005 | Han | |
| 7,165,197 B2 * | 1/2007 | Park et al. | 714/718 |
| 2002/0172073 A1 | 11/2002 | Hidaka | |
| 2003/0123281 A1 | 7/2003 | Iwata et al. | |
| 2004/0001360 A1 | 1/2004 | Subramanian et al. | |

OTHER PUBLICATIONS

"A 16 Mb MRAM Featuring Bootstrapped Write Drivers," 2004 IEEE, Symposium on VLSI Circuits, Digest of Technical Papers, by J. DeBrosse, pp. 454-457.

* cited by examiner

*Primary Examiner*—Son T. Dinh
*Assistant Examiner*—Nam Nguyen
(74) *Attorney, Agent, or Firm*—Saile Ackerman LLC; Stephen B. Ackerman; Billy Knowles

(57) ABSTRACT

An MRAM reference cell sub-array provides a mid-point reference current to sense amplifiers. The MRAM reference cell sub-array has MRAM cells arranged in rows and columns. Bit lines are associated with each column of the sub-array. A coupling connects the bit lines of pairs of the columns together at a location proximally to the sense amplifiers. The MRAM cells of a first of the pair of columns are programmed to a first magneto-resistive state and the MRAM cells of a second of the pair of columns are programmed to a second magneto-resistive state. When one row of data MRAM cells is selected for reading, a row of paired MRAM reference cells are placed in parallel to generate the mid-point reference current for sensing. The MRAM reference sub-array may be programmed electrically or aided by a magnetic field. A method for verifying programming of the MRAM reference sub-array is discussed.

8 Claims, 16 Drawing Sheets

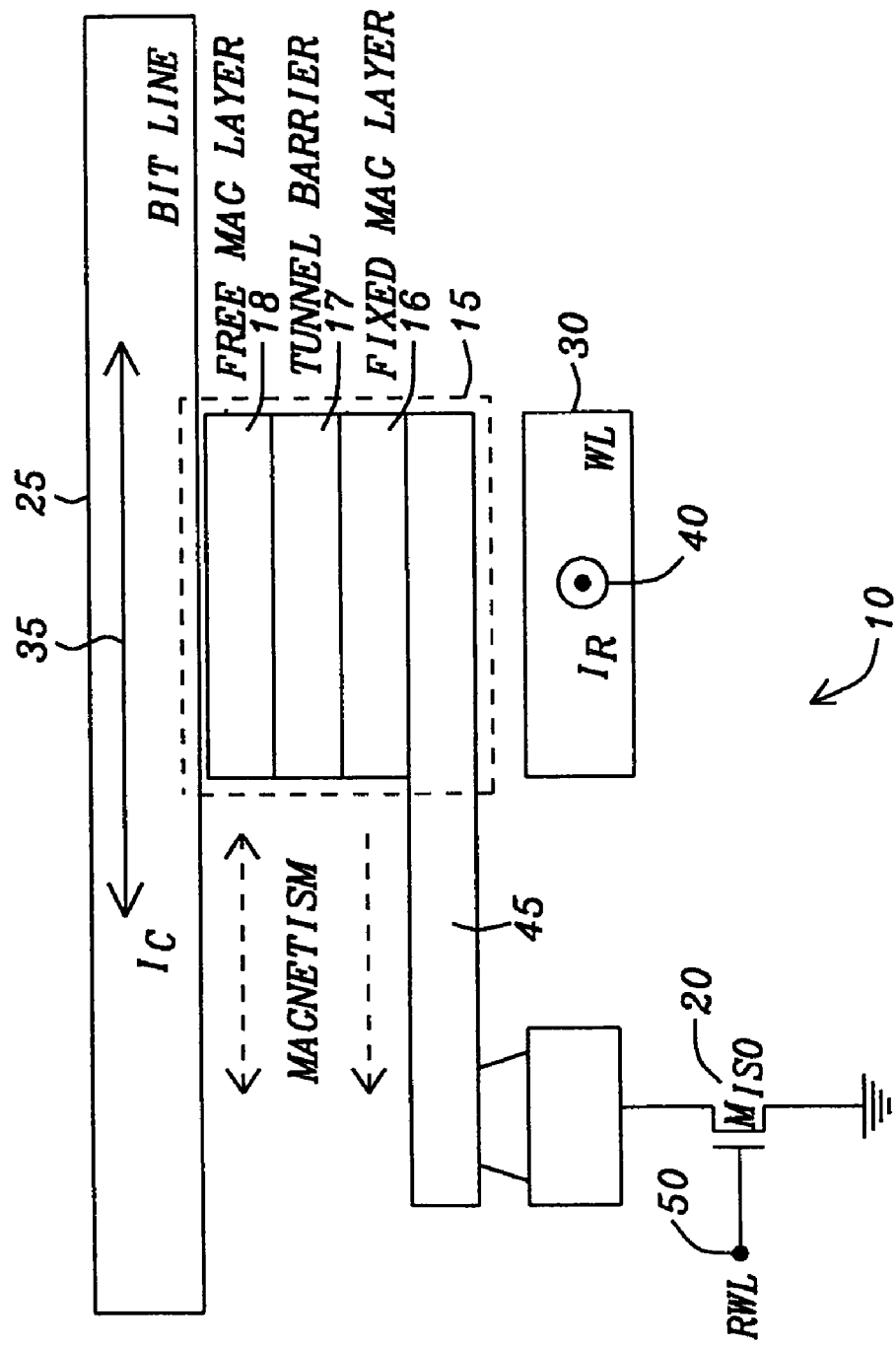
FIG. 1a – Prior Art

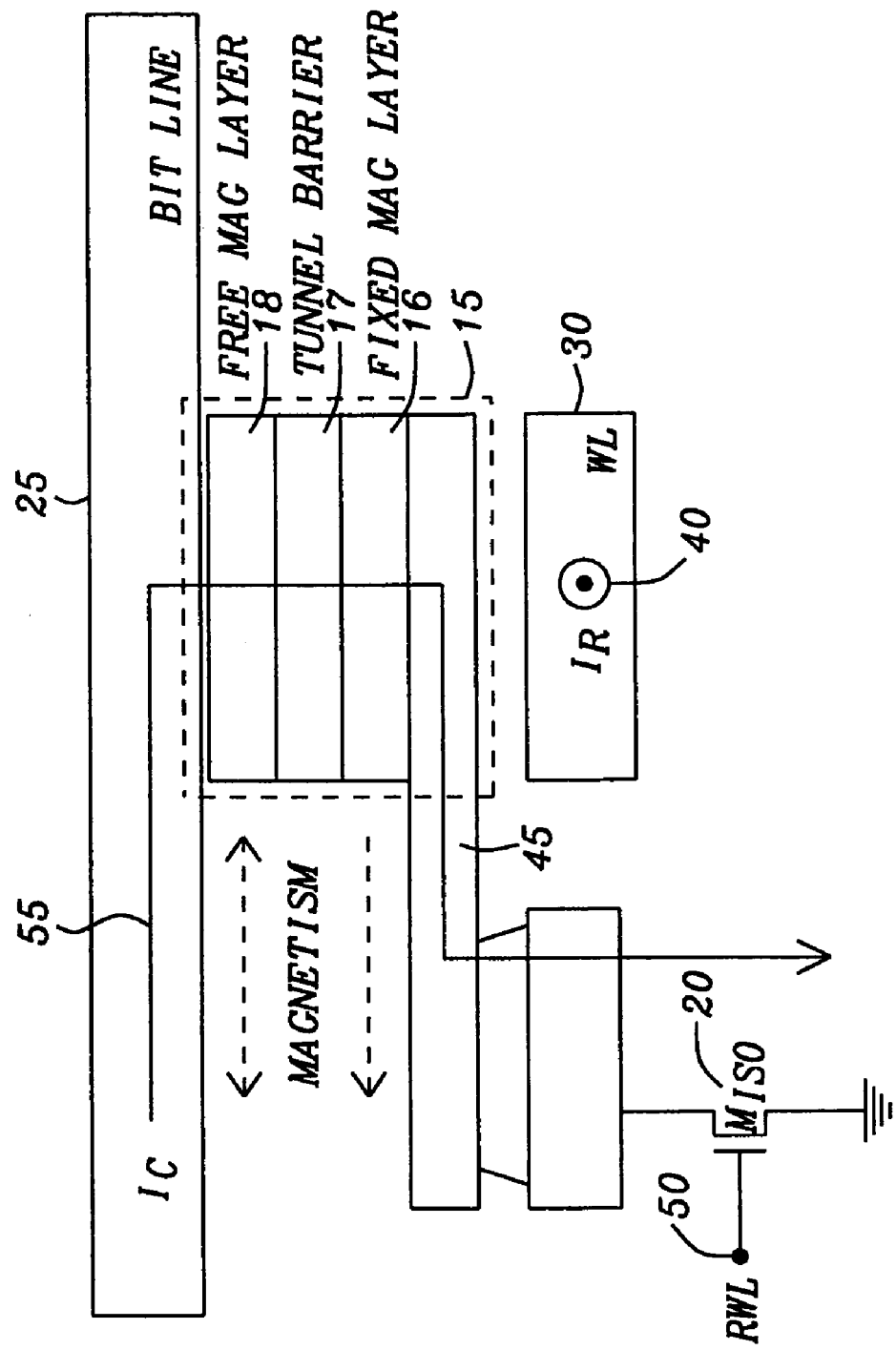
FIG. 1b – Prior Art

FIG. 3 – Prior Art

REFERENCE CELL SCHEME FOR MRAM

The present invention is a divisional application that claims priority under 35 U.S.C. §120 from U.S. patent application Ser. No. 11/284,299, filing date Nov. 21, 2005, now U.S. Pat. No. 7,321,507, issued Jan. 22, 2008, incorporated herein by reference in its entirety.

BACKGROUND OF THE INVENTION

1. Field of the Invention

This invention relates generally to memory cells, array structures for memory cells, and methods for writing and reading the memory cells. More particularly, this invention relates to magnetic random access memory (MRAM) cells, array structures for MRAM cells, and methods for writing and reading MRAM cells. Even more particularly, this invention relates to MRAM array cells employed as reference devices for determining a data state retained within an MRAM data cell.

2. Description of Related Art

As shown in FIGS. 1a and 1b, a memory array is generally formed of groups of MTJ cells 10 in columns and rows. Each MTJ cell 10 has an MTJ device 15 for retaining digital data as an orientation of the magnetic fields within the MTJ device 15. Each MTJ device 15 is formed of two layers of magnetic material 16 and 18 isolated from each other by a tunnel barrier 17. The free magnetic layer 18 is adjoined to the bit line 25. The bit line 25 conducts the cell current $I_{cell}$ 35 such that the magnetic field developed by the cell current $I_c$ 35 in the bit line 25 and the row write cell current $I_R$ 40 in the row write line conductor 30 determine the magnetic orientation of the free magnetic layer 18 and thus determine the state of digital data within the MTJ cell 15. The write line 30 is close proximity to the MTJ cell 15. The write line 30 conducts a row write cell current $I_R$ 40 in one direction. The magnetic orientation of the fixed magnetic layer 16 is determined during manufacturing of the MTJ device 15.

The fixed magnetic layer 16 is adjoined to a conductor 45 that is connected to the drain of an isolation transistor $M_{ISO}$ 20. The source of the isolation transistor $M_{ISO}$ 20 is connected to the ground reference point. The gate of the isolation transistor $M_{ISO}$ 20 is connected to a read word line RWL In the write operation of the MTJ cell 10, the direction of conduction cell current $I_{cell}$ 35 determines the magnetic orientation of the free magnetic layer 18 and thus the digital data state retained by the MTJ cell 10. During the write process, the read word line RWL 50 deactivates the isolation transistor $M_{ISO}$ 20 to prevent current conduction.

The read operation is illustrated in FIG. 1b. The read word line RWL 50 is set to a state to activate or turn on the isolation transistor $M_{ISO}$ 20. The cell current $I_{cell}$ 55 is passed through the bit line 25, through the MTJ device 15, and the isolation transistor $M_{ISO}$ 20 to the ground reference point. The magnetic orientation of the free magnetic layer 18 as compared to the magnetic orientation of the fixed magnetic layer 16 determine the resistance of the MTJ device 15.

FIG. 2 shows the schematic diagram of the MRAM cell 10 with the MTJ device 15 and the isolation transistor $M_{ISO}$ 20 serially connected. The read word line RWL 50 controls the activation and deactivation of the isolation transistor $M_{ISO}$ 20. The bit line 25 is relative to the free magnetic layer 18 as described above for writing the free magnetic layer 18 and for reading the MTJ cell 10.

Referring now to FIG. 3 for a more detailed description of the read operation of the prior art. A group of MRAM cells 10 are organized in rows and columns to for an MRAM array 5. The bit lines 25 are connected such that they adjoin the free magnetic layers of each MTJ device 15 of each MRAM cell 10 of a column. The write line WL 30 and the read word line RWL 50 are connected for each row of the MRAM cells 10. The write line WL 30 being adjoined to the MTJ device 15 of each of the rows of MRAM cells 10 for writing selected MTJ devices 15 of each of the rows of the MRAM cells 10. The read word line RWL 50 connected to control the activation and deactivation of the isolation transistor $M_{ISO}$ 20 of each row of the MRAM cells 10.

During a read operation, the cell current $I_c$ 55 passes through the selected MRAM cell 10. The cell current $I_{cell}$ 55 develops a across the MTJ device 15 which is a first input to the sense amplifier 60. A voltage that is developed at the second input of the sense amplifier 60 is a reference voltage $V_{REF}$ for determining the state of the digital data retained by the MRAM cell 10. The reference voltage $V_{REF}$ is developed across the MRAM reference cell 65. The data voltage $V_{DAT}$ is compared with the reference voltage $V_{REF}$ to determine the digital data retained by the MRAM cell 10.

The MRAM reference cell 65 is formed of the series/parallel combination of MTJ devices 67a and 67b that are magnetized to have a minimum resistance and the MTJ devices 69a and 69b. This series/parallel combination of the MTJ devices 67a, 67b, 69a, and 69b is equivalent to the mid-point resistance of the maximum and minimum resistances of the MTJ devices 67a, 67b, 69a, and 69b. The reference bit line 70 conducts a reference current $I_{REF}$ 75 through the MRAM reference cell 65 to develop the reference voltage $V_{REF}$ at the second input of the sense amplifier 60.

"A 16 Mb MRAM Featuring Bootstrapped Write Drivers", DeBrosse, et al., Digest of Technical Papers, 2004 Symposium on VLSI Circuits, June 2004 pp.: 454-457 describes a cell, architecture, and circuit techniques unique to multi-Mb MRAM design, including a novel bootstrapped write driver circuit. The 16 Mb MRAM uses three-Cu-level CMOS with a three-level MRAM process adder and features a X16 asynchronous SRAM-like interface.

U.S. Pat. No. 6,816,403 (Brennan, et al.) describes a capacitively coupled sensing apparatus for cross point MRAM devices. The apparatus establishes an offset voltage of a sense amplifier. The sense amplifier is selectively coupled to a selected bit line within the MRAM device. The selected bit line is in communication with an MRAM cell to be read. A read current is applied through the MRAM cell to be read, and a reference current is applied through the selected bit line. A signal voltage is sensed on the selected bit line. The signal voltage is generated in response to the read current and the reference current. The signal voltage is coupled to an input of the sense amplifier, wherein the sense amplifier provides an offset corrected output reflective of the data state of the MRAM cell.

U.S. Pat. No. 6,845,037 (Han) teaches a reference cell that produces a voltage rise on a bit line that is proportional to, and preferably half of, the voltage rise on another bit line produced by a thinly capacitively coupled thyristor (TCCT) based memory cell in an "on" state. The reference cell includes a negative differential resistance (NDR) device. A gate-like device is disposed adjacent to the NDR device and a first resistive element is coupled between the NDR device and the bit line. A second resistive element is coupled between a sink and the bit line. Resistances of the first and second resistive elements are about equal and about twice as much as the resistance of a pass transistor of a TCCT based memory cell.

U.S. Pat. No. 6,711,068 (Subramanian, et al.) illustrates a memory with a sensing scheme that maintains impedance balance between the route that the data takes to the sense amplifier and the route the reference or references take to the sense amplifier. Each sub-array of the memory has an adjacent column decoder that couples data to a data line that is also adjacent to the sub-array and may be considered part of the column decoder. The data for the selected sub-array is routed to the sense amplifier via its adjacent data line. The reference that is part of the selected sub-array is coupled to the data line of a non-selected sub-array. Thus the reference, which in the case of a MRAM type memory is preferably in close proximity to the location of the selected data, traverses a route to the sense amplifier that is impedance balanced with respect to the route taken by the data.

U.S. Patent Application 2004/0001360 (Subramanian et al.) provides an MRAM that has separate read and write paths. Switchable current mirrors, each having multiple series-connected stages, receive a common reference current. A timing circuit provides control signals to word and bit decoders and to the switchable current mirrors to selectively complete current paths through a predetermined write word line and a predetermined write bit line. Bit lines are connected together at a common end, and word lines are connected together at a common end. By precharging a common rail having multiple write bit lines connected together, the write noise immunity is improved and current spikes are minimized. Groups of bit lines may be connected via a metal option to adjust a transition time of a programming current.

U.S. Pat. No. 6,754,123 (Perner, et al.) details a sensing circuit for determining the logic state of each memory cell in a resistive memory array. Each memory cell in the resistive memory array has current control isolation. The logic state of each memory cell can be determined relative to a reference cell having a pre-selected logic state. The sensing circuit includes a memory cell sensing circuit to determine a bias voltage of a memory cell. A reference cell sensing circuit determines a bias voltage of a reference cell. An isolation circuit applies an isolation voltage to turn off a current control element associated with each unselected memory cell. An adjusting circuit makes the bias voltage on the memory cell approximately equal to the bias voltage on the reference cell. A state determining circuit determines the logic state of the memory cell.

U.S. Pat. No. 6,791,887 (Hung, et al.) relates to a simplified reference current generator for a MRAM memory. The reference current generator is positioned in the vicinity of the memory cells of the MRAM, and applies reference elements which are the same as the magnetic tunnel junctions of the memory cell and bear the same cross voltages. The plurality of reference elements are used for forming the reference current generator by using one or several bit lines, and the voltage which is the same as the voltage of the memory cell is crossly connected to the reference elements so as to generate a plurality of current signals; and a peripheral IC circuit is used for generating the plurality of midpoint reference current signals and judging the data states. The midpoint reference current signals permit multiple-state memory cells, including the 2-states memory cell, and allow more accurate reading of the data.

U.S. Pat. No. 6,791,890 (Ooishi) describes a data read circuit that produces read data in accordance with a difference between currents flowing through first and second nodes, respectively. In a data read operation, a current transmitting circuit and a reference current generating circuit pass an access current corresponding to a passing current of a selected memory cell and a predetermined reference current through first and second nodes, respectively. In a test mode, a current switching circuit passes equal test currents through the first and second nodes instead of the access current and the reference current, respectively. Thereby, offset of the current sense amplifier in the data read circuit can be evaluated.

SUMMARY OF THE INVENTION

An object of this invention is to provide an MRAM memory reference cell sub-array to provide a mid-point reference current to a plurality of sense amplifiers associated with an MRAM array.

Another object of this invention is to provide groups of data MRAM sub-arrays into which MRAM memory reference cell sub-array are interspersed such that data from one group of the MRAM sub-arrays is compared to the mid-point reference current of an MRAM reference sub-array of another group.

Even another object of this invention is to provide for programming the MRAM reference sub-arrays using an external field generating source.

Further, another object of this invention is to provide a method for programming pairs of columns of MRAM memory reference sub-arrays are programmed by conducting a programming current on one column in one direction and on a second column in an opposite direction simultaneously.

To accomplish at least one of these objects, an MRAM reference cell sub-array has a plurality of MRAM cells arranged in rows and columns. The MRAM reference sub-array has a plurality of bit lines, each bit line associated with a free magnetic layer of each MRAM cell of a column of the plurality of MRAM cells. A coupling connects the bit lines of pairs of the columns of the plurality of MRAM cells together at a location proximally to the sense amplifiers. The MRAM cells of a first column of the pair of columns of the plurality of MRAM cells are programmed to a high magneto-resistive state and a second column of the pair of columns of the plurality of MRAM cells are programmed to a low magneto-resistive state. When one row of MRAM cells is selected for reading, two of the MRAM cells are placed in parallel to generate the mid-point reference current.

The MRAM reference cell sub-array further includes a plurality of write word lines, each write word line associated with one row of the plurality of MRAM cells. A current source provides a write word line current for programming each MRAM cell of a selected row of the MRAM cells. Each of the plurality of write lines is connected to a gate of a select transistor between the current source and the write word lines. When the select transistor is activated, the word line current is transferred on said write word line of each of the MRAM cells on the selected row.

Each MRAM cell of the MRAM reference cell sub-array is programmed by selectively conducting the word line current through each of the write word lines. The free magnetic layer of each MRAM reference cell of a column pair of the MRAM reference cell sub-array is programmed by isolating the plurality of MRAM cells from the plurality of sense amplifiers. A free layer programming current is conveyed in a desired direction on the bit lines of the first column of each of the pairs of columns of MRAM cells. The free layer programming current is then transferred through the coupling to each bit line of the second column of the pairs of columns of MRAM cells to flow in an opposing direction to program an MRAM reference cell on the second column associated with the selected MRAM reference cell of the first column of MRAM reference cells. The programming of each of the MRAM cells is completed by terminating the free layer programming current, terminating the word line current, and reconnecting each of the plurality sense amplifiers to communicate with each its associated column of MRAM cells.

An alternate to the programming of the plurality of MRAM cells is started by isolating the plurality of MRAM cells from the plurality of sense amplifiers. A magnetic field having a desired orientation is placed in close proximity to the plurality of MRAM cells. The desired orientation being equivalent to the orientation of the magnetic field created by the word line current. The free layer programming current is conveyed in a first direction on each bit lines of the first column of the pairs of columns of MRAM cells. The free layer programming current is then transferred through the coupling to each bit line of the second column of the pairs of columns of MRAM cells. The programming of each of the MRAM cells is completed by terminating the magnetic field then the bit line current and reconnecting each of the plurality sense amplifiers to communicate with each its associated column of MRAM cells.

The MRAM reference cell sub-array further has a plurality of read word lines. Each read word line is connected to activate an isolation transistor of each MRAM cell of a row of the plurality of MRAM cells.

The programming of each of the MRAM cells is verified by first isolating the plurality of MRAM cells from the plurality of sense amplifiers. Each column of the columns of the plurality of MRAM cells is then biased. An activation signal is applied to the read word line of each row of the plurality of MRAM cells. A current passing through each pair of columns of the columns for each row of the MRAM cells is then measured and the current passing through each pair of columns is determined if it is equivalent to a normal current. If the current passing through each pair of columns is not equivalent to the normal current, the MRAM cells are then reprogrammed until the current through the each of the MRAM cells of each column is equivalent to the normal current.

In a second embodiment of this invention, an MRAM cell sub-array has a plurality of MRAM cells arranged in rows and columns. Each of a plurality of bit lines is associated with a free magnetic layer of each MRAM cell of a column of the plurality of MRAM cells. A coupling connects the bit lines of at least one pair of the columns of the plurality of MRAM cells together at a location proximally to the sense amplifier to form a reference column pair of MRAM cells. The reference column pair of MRAM cells provides a mid-point reference current to a plurality of sense amplifiers associated the MRAM cell sub-array. One of the paired MRAM cells of the pair of columns is programmed to a high magneto-resistive state and the other of the paired MRAM cell of the pair or columns is programmed to a low magneto-resistive state such that when one row of MRAM cells are selected for reading, two of the MRAM cells are placed in parallel to generate the mid-point reference current. In reading data from selected MRAM data cells of a selected MRAM cell sub-array, the MRAM data cells containing the digital data are resident in a different group from its associated MRAM cell sub-array containing reference column pair of MRAM cells that provide said mid-point reference current to the associated sense amplifiers.

BRIEF DESCRIPTION OF THE DRAWINGS

FIGS. 1a and 1b are cross sectional diagrams of an MRAM cell of the prior art.

DETAILED DESCRIPTION OF THE INVENTION

Figure 2:
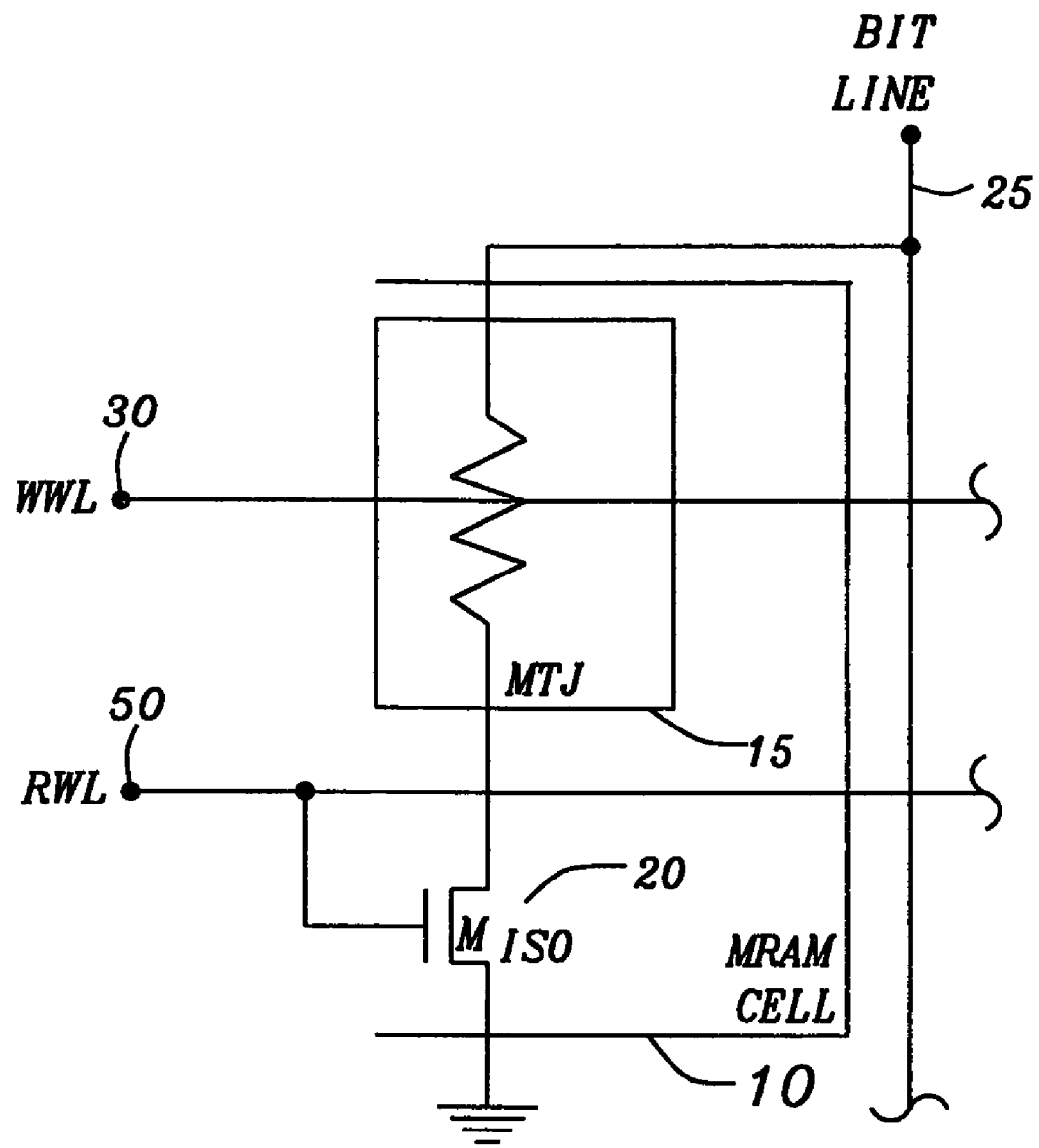
FIG. 2 is a schematic diagram of an MRAM cell.
Figure 3:
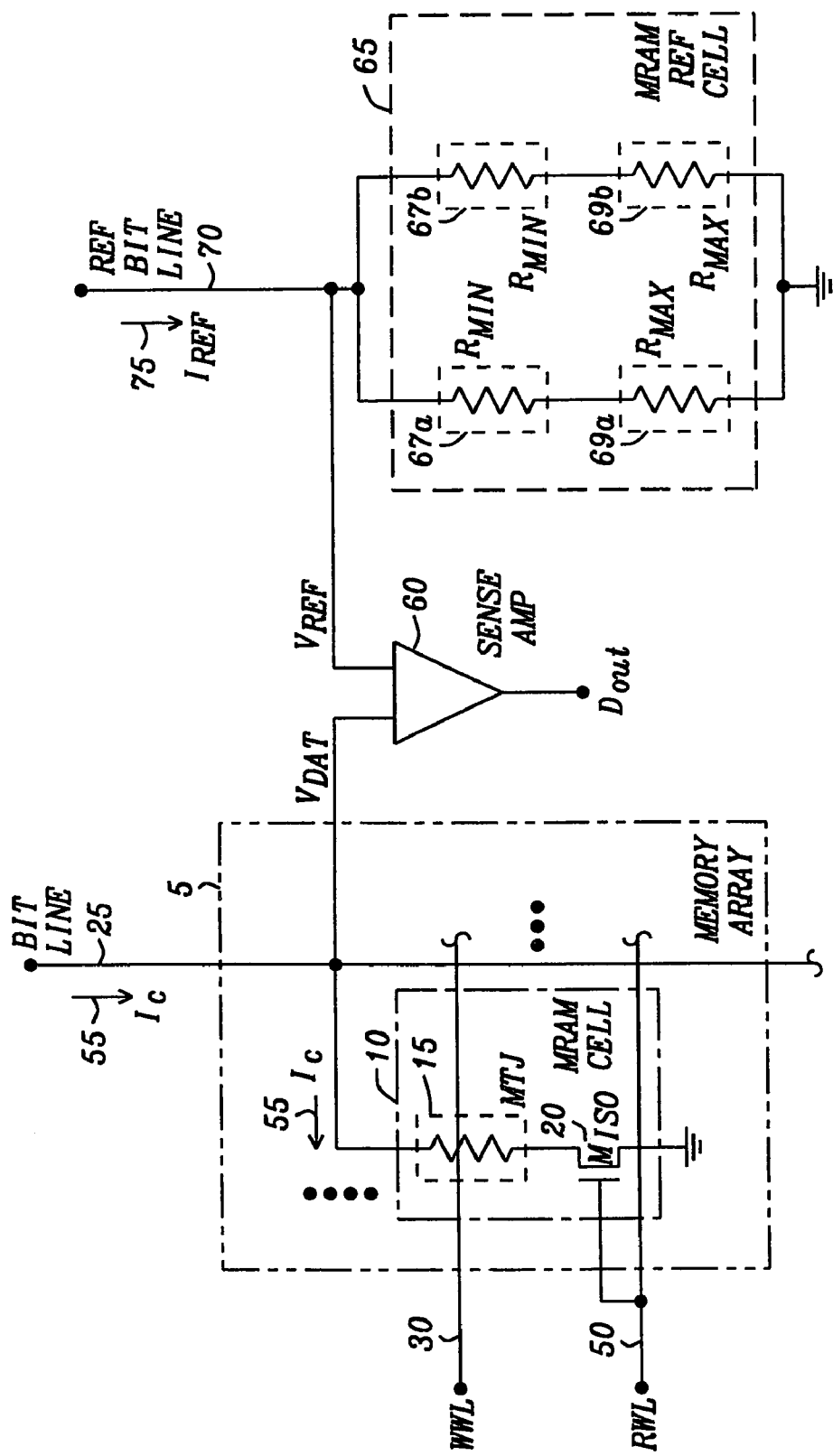
FIG. 3 is schematic diagram of the read circuit, with a reference voltage generator of prior art.
Figure 4:
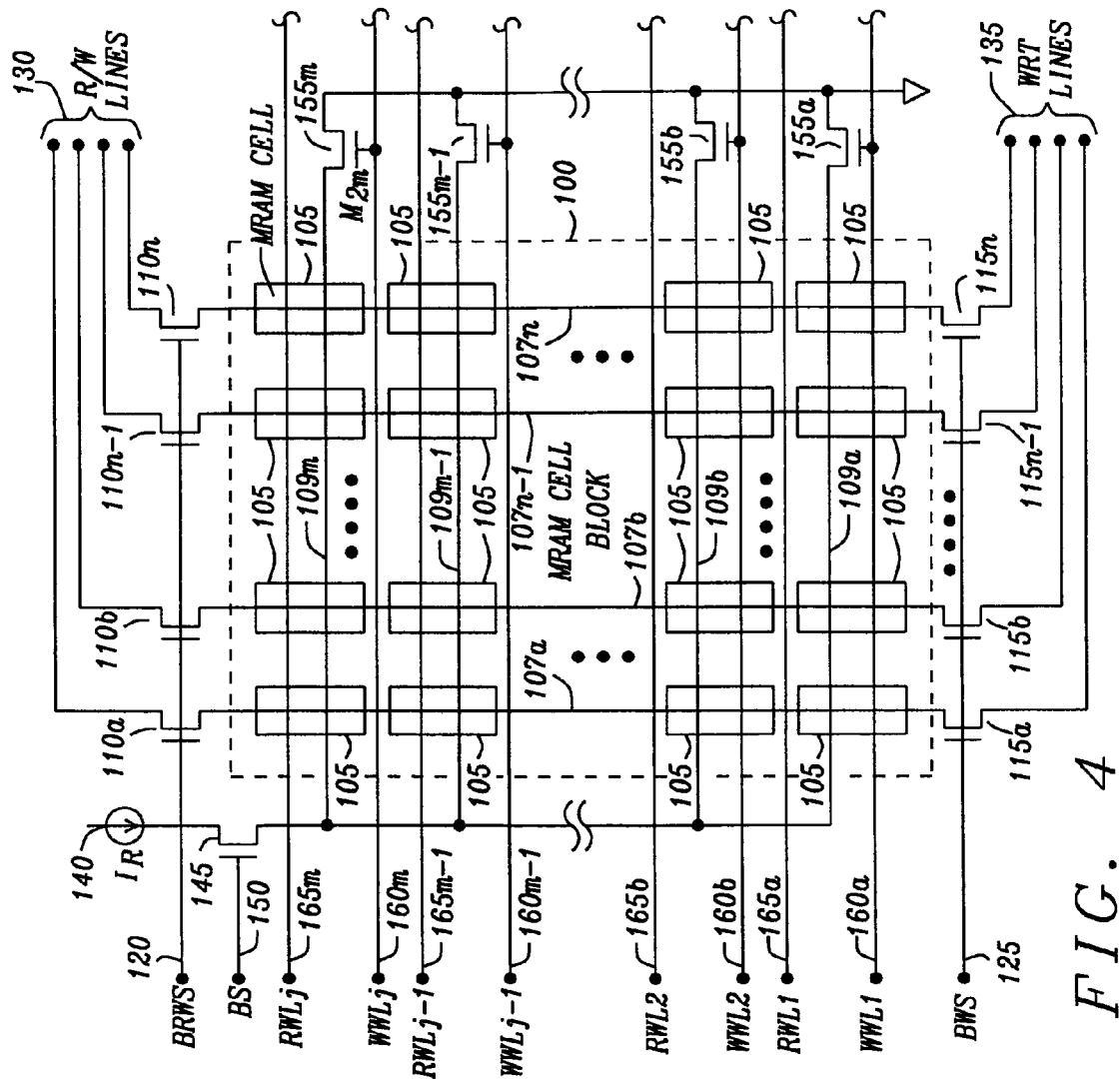
FIG. 4 is a schematic diagram of a first embodiment of an MRAM cell sub-array of this invention.

The MRAM data cell sub-array 100 of this invention is illustrated in FIG. 4. The MRAM memory cells 105 are organized in rows and columns. Each MRAM memory cell 105 is structured and functions as described in FIGS. 1a and 1b. Each column of the MRAM memory cells 105 has a bit line 107a, 107b, . . . , 107n−1, 107n placed such that the bit line 107a, 107b, . . . , 107n−1, 107n is adjoined to the free magnetic layer of each of the MRAM memory cells 105. Similarly, each row of the MRAM memory cells 105 has write line 109a, 109b, . . . , 109m−1, 109m placed such that the write line 109a, 109b, . . . , 109m−1, 109m is in close proximity to each of the MRAM memory cells 105.

One end of each bit line 107a, 107b, . . . , 107n−1, 107n is connected to a source of a Block Read/Write Select transistor 110a, 110b, . . . , 110n−1, 110n. At the opposite end of each bit line 107a, 107b, . . . , 107n−1, 107n is connected to a drain of a Block Write Select transistor 115a, 115b, . . . , 115n−1, 115n. The drains of the Block Read/Write Select transistors 110a, 110b, . . . , 110n−1, 110n are each connected to one of the Read/Write Lines 130 and the sources of the Block Write Select transistors 115a, 115b, . . . , 115n−1, 115n are each connected to one of the Write Lines 135. The Block Read/Write Select Line 120 is connected to each gate of the Block Read/Write Select transistors 110a, 110b, . . . , 110n−1, 110n and the Block Write Select Line 125 is connected to each gate of the Block Write Select transistors 115a, 115b, . . . , 115n−1, 115n.

One end of all of the write lines 109a, 109b, . . . , 109m−1, 109m are connected to the source of the Block Select transistor 145. Each of the opposing ends of the write lines 109a, 109b, . . . , 109m−1, 109m is connected to a drain of a Row Write Select transistor 155a, 155b, . . . , 155m−1, 155m. The drain of the Block Select transistor 145 is connected to the Row Current Source 140. The gate of the Block Select transistor 145 is connected to the Block Select Line 150. The sources of each of the Row Write Select transistors 155a, 155b, . . . , 155m−1, 155m are connected to the ground reference point. Each of the gates of the Row Write Select transistors 155a, 155b, ..., 155m-1, 155m is connected to a Row Write Select Line 160a, 160b, ..., 160m-1, 160m. The Block Select Line controls the activation and deactivation of the Block Select transistor 145 to control the flow of the row write cell current from Row Current source 140 through a selected row of the MRAM memory cells 105. The Row Write Select Line (WWL) 160a, 160b, ..., 160m-1, 160m control the activation and deactivation of the Row Write Select transistors 155a, 155b, ..., 155m-1, 155m to steer the row write cell current from the Row Current source 140 through the selected write line 109a, 109b, ..., 109m-1, 109m.

Each row of the MRAM memory cells 105 has a Read Word Line 165a, 165b, ..., 165m-1, 165m connected to the gate of the isolation transistor of each of the MRAM memory cells 105. The Read Word Lines 165a, 165b, ..., 165m-1, 165m control the activation and deactivation of the isolation transistors of each of the MRAM memory cells 105 with the selected row of the MRAM data cell sub-array 100 being activated during a read operation to conduct the read current from the associated bit lines 107a, 107b, ..., 107n-1, 107n through the MTJ device of the selected MRAM memory cells 105.

Writing cells within a row or column of the MRAM memory cells 105 is accomplished by setting the state of the Block Read/Write Select Line 120 to turn on the Block Read/Write Select transistors 110a, 110b, ..., 110n-1, 110n for the entire block. Similarly, the state of the Block Write Select Line 125 is set to turn on the Block Write Select transistors 115a, 115b, ..., 115n-1, 115n. A cell write current is transferred between the read/write lines 130 and the write lines 135. The direction of the cell current being determined by the state of the digital data being written.

To complete the setting of the magnetic orientation in the selected MRAM memory cell(s) 105, the state of the Block Select Line 150 is set to turn on the Block Select transistor 145 to allow the row write cell current of the Row Current source 140 to flow through a selected write line 109a, 109b, ..., 109m-1, 109m. The state of a selected Row Write Select Line 160a, 160b, ..., 160m-1, 160m is set to turn one of the Row Write Select transistors 155a, 155b, ..., 155m-1, 155m to allow the row write cell current to flow through the selected write line 109a, 109b, ..., 109m-1, 109m. The row write cell current and the column write cell current sets up the magnetic fields that sets the magnetic orientation of the free layer of the selected MRAM memory cell(s) 105. If both the row write cell current and the column cell current do not pass through the appropriate selected MRAM memory cells 105, the magnetic orientation of the cell is not modified. Both the row write cell current and the column cell current must flow for the modification of the magnetic orientation of the selected MRAM memory cell(s) 105.

The read operation of selected MRAM memory cell(s) 105 the MRAM data cell sub-array 100 is accomplished by setting the state of the Block Read/Write Select Line 120 to turn on the Block Read/Write Select transistors 110a, 110b, ..., 110n-1, 110n for the entire block. The state of the Block Write Select Line 125 is set to turn off the Block Write Select transistors 115a, 115b, ..., 115n-1, 115n. The state of the Read Word Line 165a, 165b, ..., 165m-1, 165m is set to turn on the isolation transistor of each of the selected row of MRAM memory cells 105. A cell is set on the read/write lines 130 to the bit lines 107a, 107b, ..., 107n-1, 107n and thus to the row of selected MRAM memory cells 105 and through the selected MRAM memory cells 105. The cell bias voltage causes a current to pass through the MTJ device of the selected MRAM memory cells 105. The current developed by the bias voltage across the MTJ device of the selected MRAM cells is sensed by a sense amplifier whose operation is described hereinafter.

Figure 5:
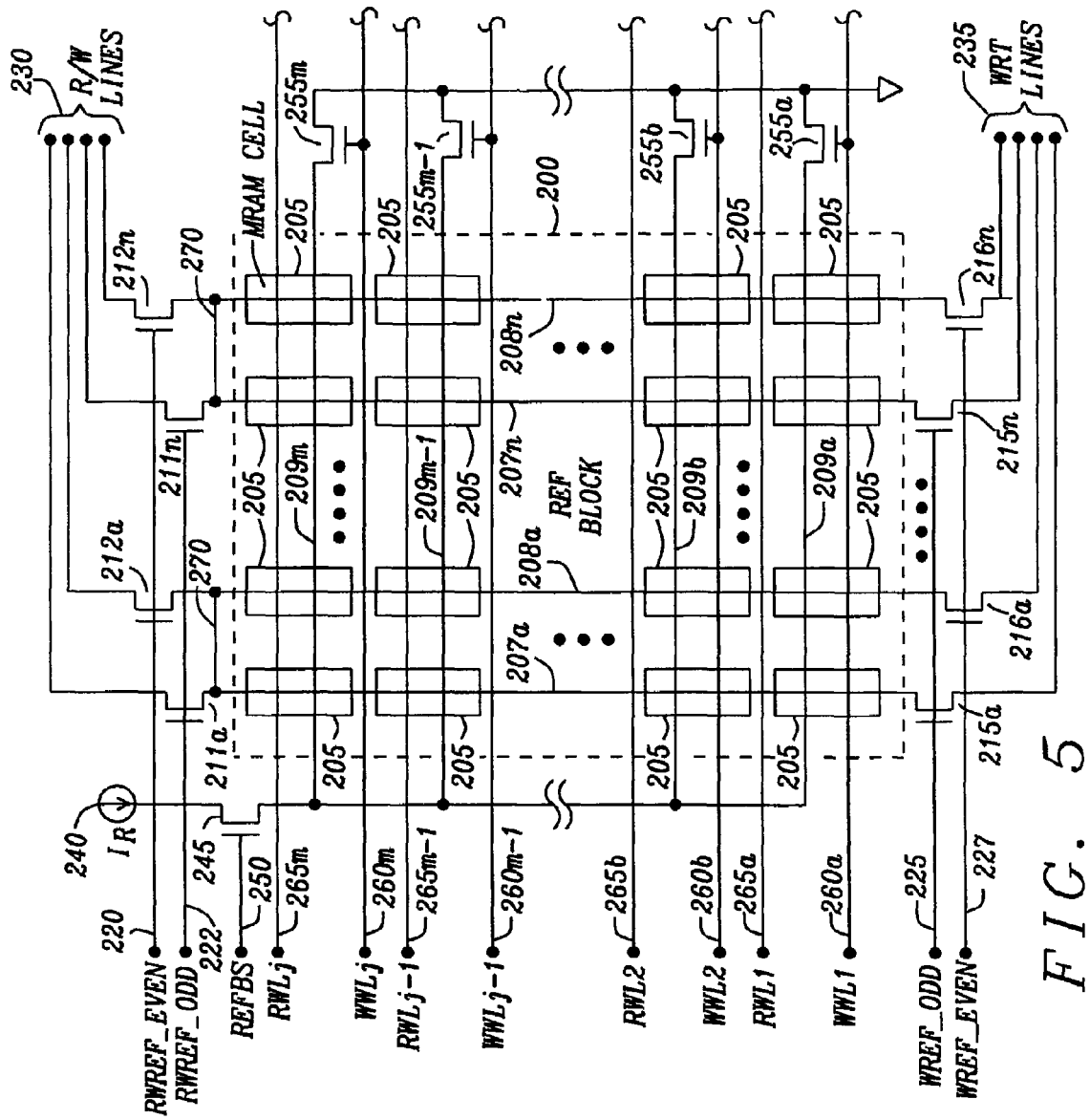
FIG. 5 is a schematic diagram of an MRAM reference cell sub-array of this invention.

Refer to FIG. 5 for a discussion of the MRAM reference cell sub-array 200 of this invention. The MRAM memory cells 205 are organized in rows and columns. Each MRAM memory cell 205 is structured and functions as described in FIGS. 1a and 1b. Each column of the MRAM memory cells 205 has a bit line 207a, ..., 207n and 208a, ..., 208n placed such that the bit line 207a, ..., 207n and 208a, ..., 208n is adjoined to the free magnetic layer of each of the MRAM memory cells 205. The columns of the MRAM memory cells 205 are divided in pairs. The bit lines 207a, ..., 207n and 208a, ..., 208n of the paired columns of the MRAM memory cells 205 are coupled together with the bridging connection 270. One of the paired MRAM memory cells 205 of one column of the paired columns of the MRAM memory cells 205 is programmed to have a magnetic orientation to have a high magneto-resistive state and the second of the paired MRAM memory cells 205 of the second column of the paired columns of the MRAM memory cells 205 is programmed to have a magnetic orientation to have a low magneto-resistive state. The MRAM memory cells 205 of each column of the paired columns of the MRAM memory cells 205 are selectively programmed to either the high magneto-resistive state or the low magneto-resistive state. Its paired neighboring MRAM memory cell 205 in the adjacent paired column will have the opposite magneto-resistive state.

Each row of the MRAM memory cells 205 has write line 209a, 209b, ..., 209m-1, 209m placed such that the write line 209a, 209b, ..., 209m-1, 209m is in close proximity to each of the MRAM memory cells 205.

One end of each bit line 207a, ..., 207n and 208a, ..., 208n is connected to a source of a Block Read/Write Select transistor 211a, ..., 211n and 212a, ..., 212n. At the opposite end of each bit line 207a, ..., 207n and 208a, ..., 208n is connected to a drain of a Block Write Select transistor 215a, ..., 215n and 216a, ..., 216n. The drains of the Block Read/Write Select transistors 211a, ..., 211n and 212a, ..., 212n are each connected to one of the Read/Write Lines 230 and the sources of the Block Write Select transistors 215a, ..., 215n and 216a, ..., 216n are each connected to one of the Write Lines 235. The Even Block Read/Write Reference Select Line 220 is connected to each gate of the Block Read/Write Select transistors 212a, ..., 212n that are connected to the bit lines 208a, ..., 208n adjoined to the second column of each of the pairs of MRAM memory cells 205. The Odd Block Read/Write Reference Select Line 222 is connected to each gate of the Block Read/Write Select transistors 211a, ..., 211n that are connected to the bit lines 207a, ..., 207n adjoined to the first column of each of the pairs of MRAM memory cells 205.

The Odd Block Write Reference Select Line 225 is connected to each gate of the Block Write Select transistors 215a, ..., 215n that are connected to the bit lines 207a, ..., 207n adjoined to the first column of each of the pairs of MRAM memory cells 205. The Even Block Write Reference Select Line 227 is connected to each gate of the Block Write Select transistors 216a, ..., 216n that are connected to the bit lines 208a, ..., 208n adjoined to the second column of each of the pairs of MRAM memory cells 205. The Even Block Read/Write Reference Select Line 220, Odd Block Read/Write Reference Select Line 222, Odd Block Write Reference Select Line 225, and the Even Block Write Reference Select Line 227 are used to respectively activate the each bit line 207a, ..., 207n and 208a, ..., 208n is connected to a source of a Block Read/Write Select transistors 211a, ..., 211n and 212a, ..., 212n and the Block Write Select transistor 215a, ..., 215n and 216a, ..., 216n for selecting the MRAM reference cell sub-array 200

One end of all of the write lines 209a, 209b, ..., 209m-1, 209m are connected to the source of the Block Select transistor 245. Each of the opposing ends of the write lines 209a, 209b, ..., 209m-1, 209m is connected to a drain of a Row Write Select transistor 255a, 255b, ..., 255m-1, 255m. The drain of the Block Select transistor 245 is connected to the Row Current Source 240. The gate of the Block Select transistor 245 is connected to the Block Select Line 250. The sources of each of the Row Write Select transistors 255a, 255b, ..., 255m-1, 255m are connected to the ground reference point. Each of the gates of the Row Write Select transistors 255a, 255b, ..., 255m-1, 255m is connected to a Row Write Select Line 260a, 260b, ..., 260m-1, 260m. The Block Select Line controls the activation and deactivation of the Block Select transistor 245 to control the flow of the Row Current Source 240 through a selected row of the MRAM memory cells 205. The Row Write Select Line 260a, 260b, ..., 260m-1, 260m control the activation and deactivation of the Row Write Select transistors 255a, 255b, ..., 255m-1, 255m to steer the reference current from the Row Current Source 240 through the selected write line 209a, 209b, ..., 209m-1, 209m.

Each row of the MRAM memory cells 205 has a Read Word Line 265a, 265b, ..., 265m-1, 265m connected to the gate of the isolation transistor of each of the MRAM memory cells 205. The Read Word Lines 265a, 265b, ..., 265m-1, 265m control the activation and deactivation of the isolation transistors of each of the MRAM memory cells 205 with the selected row of the MRAM data cell sub-array 200 being activated during a read operation to conduct the read current from the associated bit lines 207a, ..., 207n and 208a, ..., 208n through the MTJ device of the selected MRAM memory cells 205. The reading and writing operations using the MRAM reference cell sub-array 200 as shown will be explained hereinafter.

Figure 6:
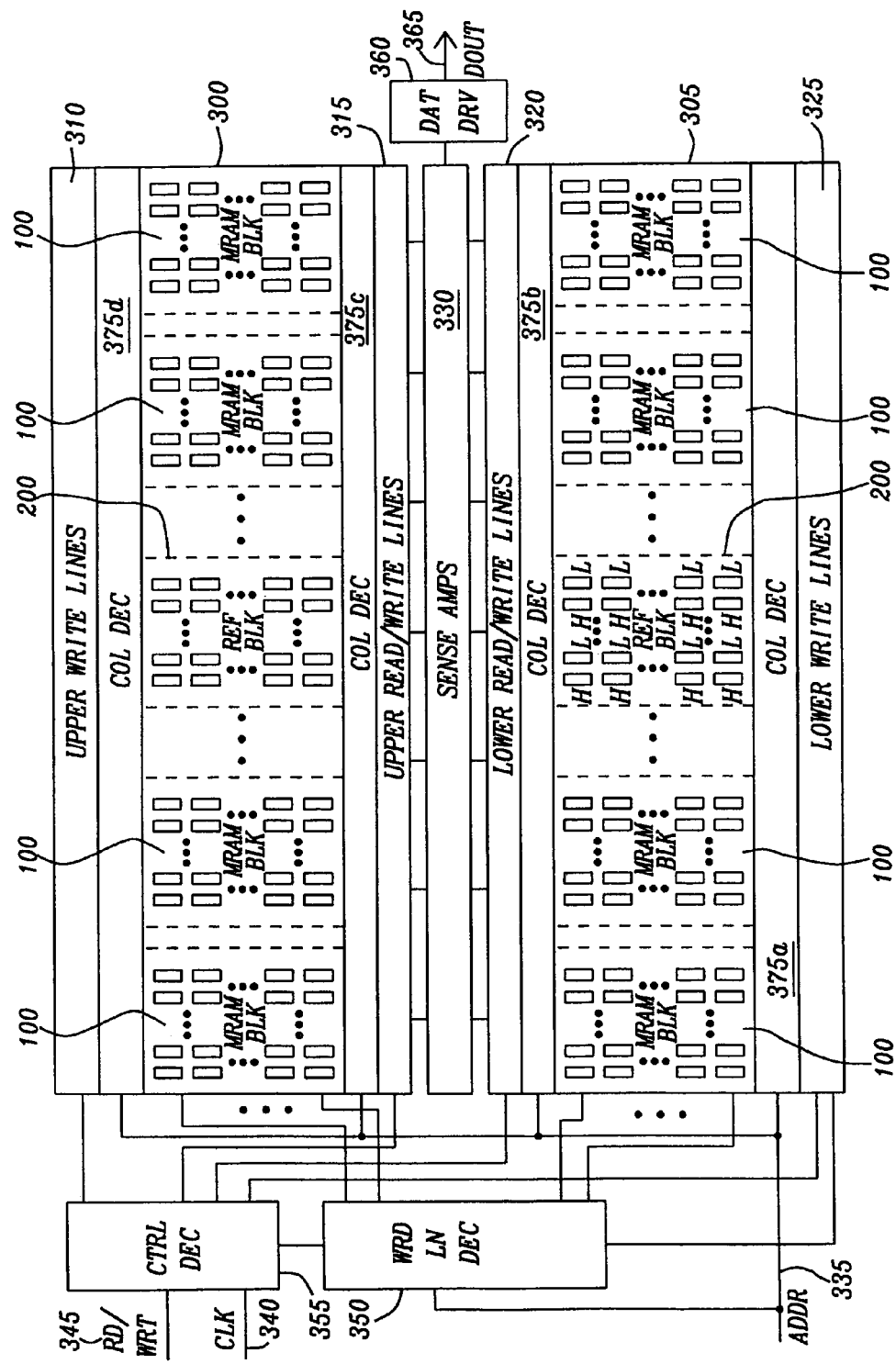
FIG. 6 is a block diagram of an MRAM array of this invention.

An array of the MRAM memory cells is shown in FIG. 6. Groups of the MRAM data cell sub-arrays 100 are collected together to form an upper MRAM array block 300 and a lower MRAM array block 305. Each of the upper and lower array blocks 300 and 305 has at least one MRAM reference cell sub-array 200 placed centrally within the upper and lower array blocks 300 and 305. The MRAM data cell sub-arrays 100 of the Upper MRAM array block 300 are connected to the Upper Write Lines 310 and the Upper Read/Write Lines 315. The Upper Write Lines 310 and the Upper Read/Write Lines 315 are structured and function as described above in FIG. 4. Similarly, the MRAM reference cell block 200 of the Lower MRAM array block 305 are connected to the Lower Write Lines 325 and the Lower Read/Write Lines 320. The Lower Write Lines 325 and the Lower Read/Write Lines 320, also, are structured and function as described above in FIG. 5.

The Upper Read/Write Lines 315 and Lower Read/Write Lines 320 are connected to the sense amplifiers 330 which detect the digital data state of the selected MRAM cells of a selected MRAM data cell sub-array 100. The MRAM reference cell sub-array 200 of the opposing lower array blocks 305 is applied to the sense amplifier 330 to generate the reference current used to determine the digital data state of the selected MRAM cell of the selected upper array blocks 300. The digital data as recovered by the sense amplifiers 330 is transferred to the data drivers 360 for transfer and the output data 365 to external circuitry. The digital data may be a single bit, or the digital data may have an eight bit, sixteen bit, or thirty-two bit digital data width.

The address bus 335 provides a digital address word that is decoded to select the location of the MRAM array containing the desired digital data. The address bus 335 is connected to the word line decoder 350 and the column decoder sections 375a, 375b, 375c, and 375d. The read/write control line 345 and the clock lines 340 provide the digital timing and control signals to the control decoder 355. The control decoder 355 provides the necessary timing and control signals to the word line decoder 350, the column decoder sections 375a, 375b, 375c, and 375d, and the upper and lower array blocks 300 and 305 to generate the signals for activating a selected MRAM data cell sub-array 100 and its associated MRAM reference cell sub-array 200 for reading the desired digital data or for writing to the selected MRAM data cell sub-array 100.

Figure 7A:
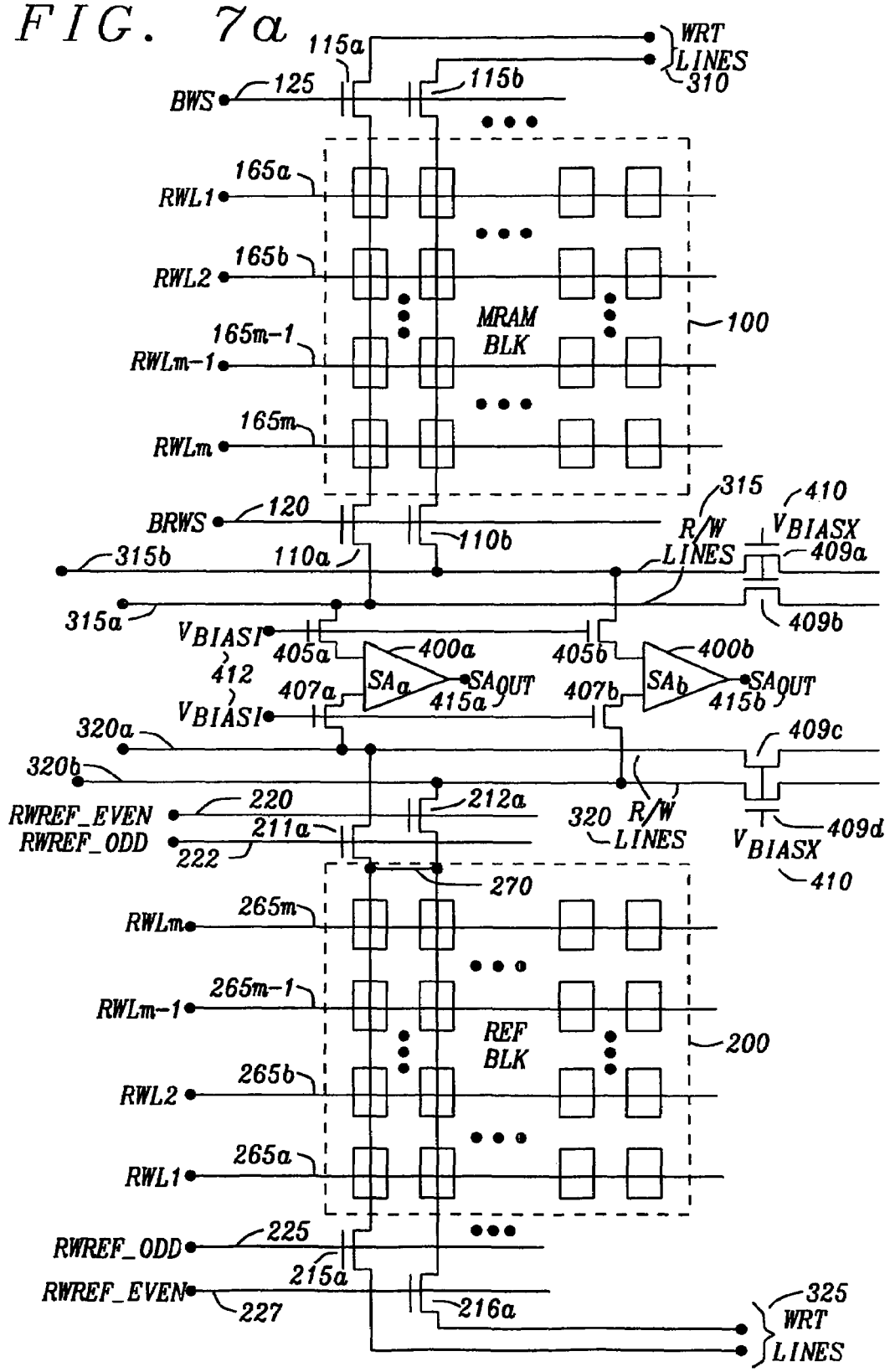
FIGS. 7a and 7b are schematic diagrams of the read circuit, with a reference current generator of this invention.

An example of the control and data flow for reading digital data from an upper MRAM array block 300 is shown in FIG. 7a in conjunction with FIG. 6. An MRAM data cell sub-array 100 from the upper MRAM array block 300 is selected for retrieving digital data. When the upper MRAM array block 300 is chosen the MRAM reference cell sub-array 200 of the lower MRAM array block 305 is automatically associated with the selected MRAM data cell sub-array 100. The column decoder sections 375 band 375c decode the incoming digital address word to determine the selected MRAM data cell sub-array 100. The column decoder sections 375b and 375c then activate the Upper Read/Write Lines 315 associated with the selected MRAM data cell sub-array 100 and sets the Block Read/Write Select Lines 120 to activate the Block Read/Write Select transistor 110a and 110b to connect the column of the MRAM cells of the selected MRAM data cell sub-array 100 to the Upper Read/Write Lines 315.

The Word Line decoder 350 decodes the incoming address word to determine the row of the MRAM data cell sub-array 100 from which the digital data is to be read. The word line decoder 350 activates the Read Word Line 165a, 165b, ..., 165m-1, 165m for the desired row to be read. As noted above the Read Word Line 165a, 165b, ..., 165m-1, 165m activates the isolation transistor of each MRAM cell on the selected row such that the current applied to the Upper Read/Write Lines 315 conducts through the MTJ of the selected MRAM cells. The Control Decoder 355 further deactivates the Block Write Select Line 125 to disconnect the Upper Write Lines 310 from the bit lines of the selected MRAM data cell sub-array 100.

When the column decoder section 375c then activates the Upper Read/Write Lines 315 associated with the selected MRAM data cell sub-array 100 and sets the Block Read/Write Select Lines 120 to activate the Block Read/Write Select transistor 110a and 110b to connect the column of the MRAM cells of the selected MRAM data cell sub-array 100 to the Upper Read/Write Lines 315, the Lower Read/Write Lines 320 are also activated and the Block Even Read/Write line 220 and the Block Odd Read/Write Line 222 are activated to turn on the Block Read/Write Select transistors 211a and 212a. The Lower Read/Write Lines 320 are thus connected to the columns of the MRAM reference cell sub-array 200. The Word Line decoder 350 activates the selected Lower Read Word Line 265a, 265b, ..., 265m-1, 265m to turn the isolation transistor of the MRAM cells of the selected row of the MRAM reference cell sub-array 200.

The first column of the MRAM data cell sub-array 100 and the first column of the MRAM reference cell sub-array 200 are respectively connected through the Upper Read/Write Line 315a and the Lower Read/Write Line 320a to the sense amplifier 400a. Similarly, the second column of the MRAM data cell sub-array 100 and the second column of the MRAM reference cell sub-array 200 are respectively connected through the Upper Read/Write Line 315b and the Lower Read/Write Line 320b to the sense amplifier 400b. The sense amplifier gating transistors 405a and 407a control the application of the voltage developed across the MTJ device of the selected MRAM cell of the column of MRAM cells of the MRAM data cell sub-array 100 and the parallel MTJ devices of the paired columns of MRAM cells of the MRAM reference cell sub-array 200 to the sense amplifier 400a. Correspondingly, the sense amplifier gating transistors 405b and 407b control the application of the voltage developed across the MTJ device of the selected MRAM cell of the column of MRAM cells of the MRAM data cell sub-array 100 and the parallel MTJ devices of the paired columns of MRAM cells of the MRAM reference cell sub-array 200 to the sense amplifier 400b.

Figure 7B:
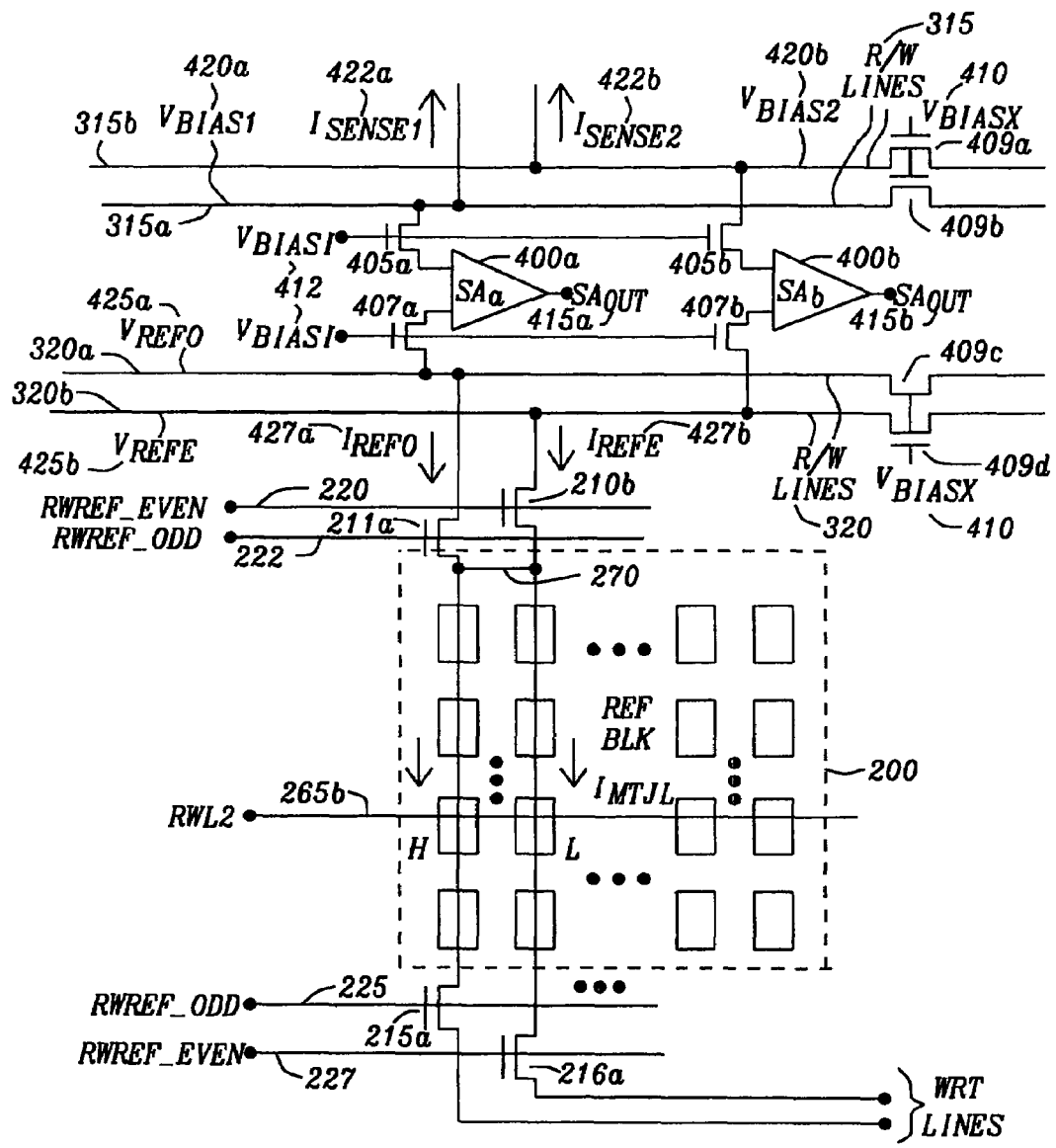

Referring to FIG. 7b, the internal switching bias voltage $V_{BIASI}$ turns the sense amplifier gating transistors 405a, 405b, 407a, and 407b on to be in deep saturation to keep the source node voltage of the sense amplifier gating transistors 405a, 405b, 407a, and 407b at the desired biasing voltage level necessary for conduction of the MTJ devices of the MRAM cells of the MRAM data cell sub-array 100 and the MRAM reference cell sub-array 200. Each of the Upper Read/Write Lines 315a and 315b are respectively set to the biasing voltage levels $V_{BIAS1}$ 420a and $V_{BIAS2}$ 420b. The biasing voltage levels $V_{BIAS1}$ 420a causes the sense current $I_{SENSE1}$ 422a and $V_{BIAS2}$ 420b causes the sense current $I_{SENSE2}$ 422b to flow through the bit lines of the columns of the MRAM data cell sub-array 100 to the selected row of the MRAM cells. The resistance of the MTJ of the selected row of MRAM cells determines the sense currents $I_{SENSE1}$ 422a and $I_{SENSE2}$ 422b.

The Lower Read/Write Lines 320a and 320b are respectively set to the reference biasing voltage levels $V_{REFO}$ 425a and $V_{REFE}$ 425b. The reference biasing voltage levels $V_{REFO}$ 425a causes the reference current $I_{REFO}$ 427a and $V_{REFE}$ 425b causes the reference current $I_{REFE}$ 427b to flow through the bit lines of the columns of the MRAM reference cell sub-array 200 to the selected row of the MRAM cells. The resistance of the MTJ of the selected row of MRAM cells determines the reference currents $I_{REFO}$ 427a and $I_{REFE}$ 427b.

Assuming MTJ devices of the first column of the pair of columns of the MRAM reference cell sub-array 200 are programmed to have the free magnetic layer have an opposing magnetic orientation to the fixed magnetic and thus have a higher resistance and the MTJ devices of the second column of the pair of columns of the MRAM reference cell sub-array 200 are programmed to have the free magnetic layer have an aligned magnetic orientation to the fixed magnetic and thus have a lower resistance, the current $I_{MTJH}$ of the first column has a lower magnitude than the current $I_{MTJL}$ of the second column. The coupling 270 of the paired columns of the MRAM reference cell sub-array 200 causes each of the reference currents $I_{REFO}$ 427a and $I_{REFE}$ 427b to be essentially one half of the sum of the currents $I_{MTJH}$ and $I_{MTJL}$ or the average of the two currents $I_{MTJH}$ and $I_{MTJL}$.

The reference currents $I_{REFO}$ 427a and $I_{REFE}$ 427b act as the reference input currents for the sense amplifiers 400a and 400b. The sense currents $I_{SENSE1}$ 422a and $I_{SENSE2}$ 422b are respectively applied to the sense amplifiers 400a and 400b. The sense amplifiers 400a and 400b are differential amplifiers that compare the sense currents $I_{SENSE1}$ 422a and $I_{SENSE2}$ 422b with the reference currents $I_{REFO}$ 427a and $I_{REFE}$ 427b to determine the digital data state of MRAM cells at the outputs 415a and 415b of the sense amplifiers 400a and 400b.

The Upper Read/Write Lines 315 are disconnected from external circuitry by External Connection gating transistors 409a and 409b and the Lower Read/Write Lines 320 are disconnected from external circuitry by External Connection gating transistors 409c and 409d. The function of the External Connection gating transistors 409a, 409b, 409c, and 409d is explained hereinafter.

Figure 8:
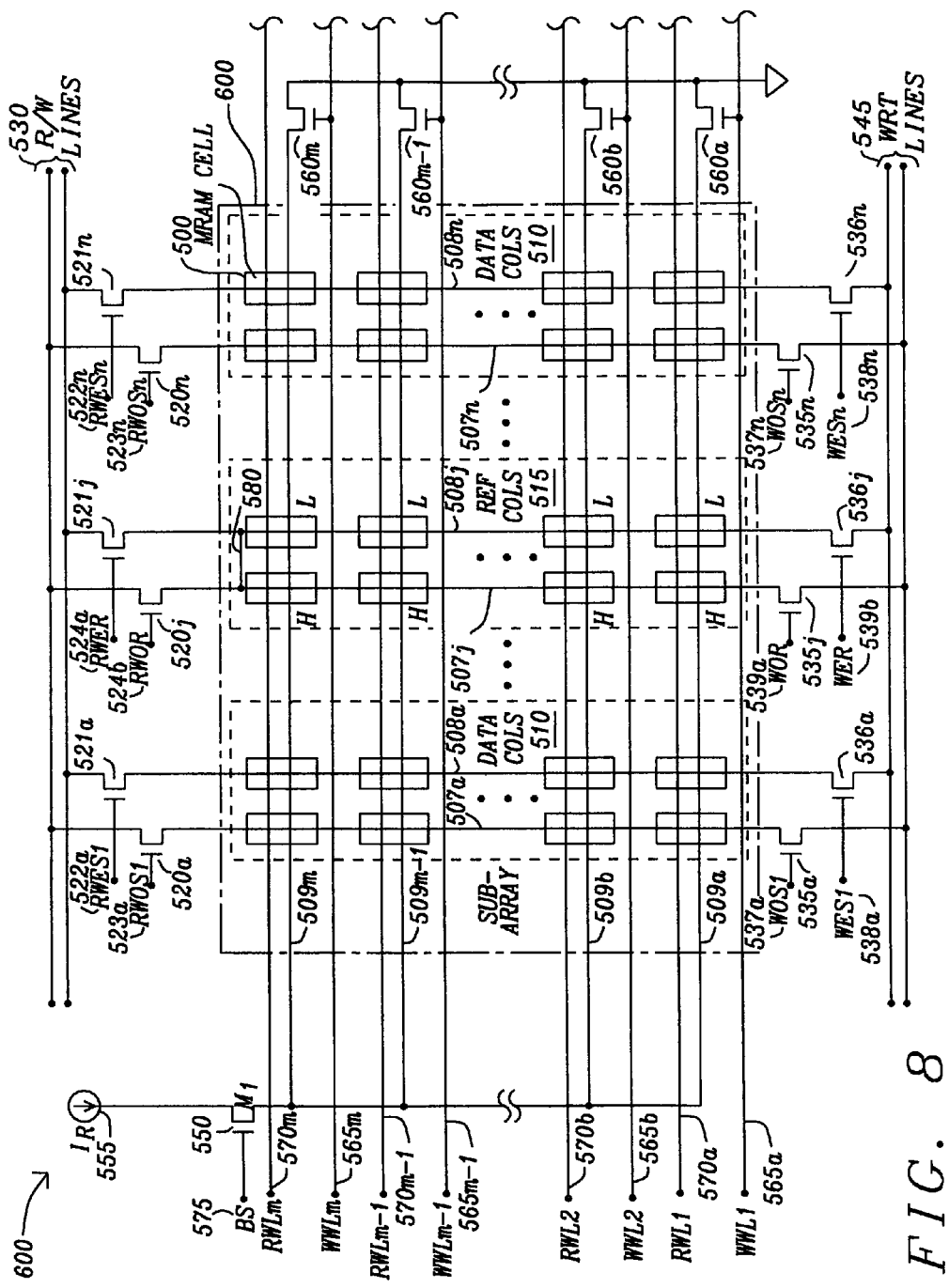
FIG. 8 is schematic diagram of a second embodiment of an MRAM sub-array of this invention including column pairs of the MRAM reference cells of this invention.

In a second embodiment of the MRAM sub-array 600 of this invention, as shown in FIG. 8, groups of the MRAM cells 500 are organized in rows and columns to form an MRAM sub-array 600. The columns 510 of MRAM cells are designated for the retention of the digital data in each cell 500 of the columns 510. The MRAM cells of at least one pair of columns 515 are separated as reference MRAM cell columns. The columns of the pair of reference MRAM cell columns 515 are connected together with the bridging connection 580 similar to the bridging connector 270 of the MRAM reference cell sub-array 200 of FIG. 5. The bit lines 507a, ..., 507j, ..., 507n are adjoined to the free magnetic layer of the MTJ devices of each column of the MRAM cells 500 of the MRAM sub-array 600.

One end of each odd bit line 507a, ..., 507n is connected to a source of a Read/Write Column Select transistor 520a, ..., 520n and one end of each even bit line 508a, ..., 508n is connected to a source of a Read/Write Column Select transistor 521a, ..., 521n. The opposite end of each odd bit line 507a, ..., 507n is connected to a drain of an Odd Block Write Column Select transistor 535a, ... 535n and the opposite end of each and each even bit line 508a, ..., 508n is connected to a drain of an Even Block Write Column Select transistor 536a, ... 536n. The drains of the Read/Write Column Select transistor 520a, ..., 520n and 521a, ..., 521n are each connected to one of the Read/Write Lines 530 and the sources of the Odd Block Write Column Select transistor 535a, ..., 535n and the Even Block Write Column Select transistor 536a, ..., 536n are each connected to one of the Write Lines 545. Each of the Read/Write Even Data Column Select Lines 522a, ..., 522n is connected to each gate of the Read/Write Column Select transistor 521a, ..., 521n that are connected to the even designated bit line 508a, ..., 508n adjoined to the second column of each of the pairs of MRAM memory cells 500 of pairs of the data columns 510. Each of the Read/Write Odd Data Column Select Lines 523a, ..., 523n is connected to each gate of the Read/Write Column Select transistor 520a, ..., 520n that are connected to the odd designated bit line 507a, ..., 507n adjoined to the first column of each of the pairs of MRAM memory cells 500 of pairs of the data columns 510.

The Read/Write Even Reference Column Select Line 524a is connected to the gate of the Read/Write Column Select transistor 521j that is connected to the bit line 508j adjoined to the second column of each of the pairs of MRAM memory cells 500 of the pair of reference columns 515. Similarly, the Read/Write Odd Reference Column Select Line 524b is connected to the gate of the Read/Write Column Select transistor 520j that is connected to the bit line 507j adjoined to the first column of each of the pairs of MRAM memory cells 500 of the pair of reference columns 515. Within the reference columns 515 of the MRAM sub-array of MRAM memory cells 500, one of the pairs of MRAM memory cells 500 of one of the columns of the paired columns 515 of the MRAM memory cells 500 is programmed to have a magnetic orientation to have a high magneto-resistive state and the MRAM memory cells 500 of the second column of the paired columns 515 of the MRAM memory cells 500 is programmed to have a magnetic orientation to have a low magneto-resistive state. The MRAM memory cells 500 of each column of the paired columns 515 of the MRAM memory cells 500 are selectively programmed to either the high magneto-resistive state or the low magneto-resistive state. Its paired neighboring MRAM memory cell 500 in the adjacent paired column 515 will have the opposite magneto-resistive state.

Each of the Write Odd Data Column Select Lines 537a, . . . 537n is connected to each gate of the Write Column Select transistors 535a, . . . , 535n that are connected to the odd designated bit lines 507a, . . . , 507n adjoined to the first column of each of the pairs of columns 510 of MRAM memory cells 500. The Write Even Data Column Select Line 538a, . . . , 538n is connected to each gate of the Write Column Select transistor 536a, . . . , 536n that are connected to the even designated bit lines 508a, . . . , 508n adjoined to the second column of each of the pairs of columns 510 of MRAM memory cells 500.

The Write Odd Reference Column Select Lines 539a is connected to the gate of the Write Select transistor 535j that is connected to the bit line 507j adjoined to the first column of each of the pair of columns of MRAM memory cells 500 of the reference columns 515. The Write Even Reference Column Select Lines 539b is connected to the gate of the Write Select transistor 536j that is connected to the bit line 508j adjoined to the second column of each of the pair of columns of MRAM memory cells 500 of the reference columns 515.

Each row of the MRAM memory cells 500 has write line 509a, 509b, . . . , 509m−1, 509m placed such that the write line 509a, 509b, . . . , 509m−1, 509m is in close proximity to each of the MRAM memory cells 500. Further, one end of all of the write lines 509a, 509b, . . . , 509m−1, 509m are connected to the source of the Block Select transistor 550. Each of the opposing ends of the write lines 509a, 509b, . . . , 509m−1, 509m is connected to a drain of a Row Write Select transistor 560a, 560b, . . . , 560m−1, 560m. The drain of the Block Select transistor 550 is connected to the Row Current Source 555. The gate of the Block Select transistor 550 is connected to the Block Select Line 575. The sources of each of the Row Write Select transistors 560a, 560b, . . . , 560m−1, 560m are connected to the ground reference point. Each of the gates of the Row Write Select transistors 560a, 560b, . . . , 560m−1, 560m is connected to a Row Write Select Line 565a, 565b, . . . , 565m−1, 565m. The Block Select Line controls the activation and deactivation of the Block Select transistor 550 to control the flow of the Row Current Source 555 through a selected row of the MRAM memory cells 500. The Row Write Select Line 565a, 565b, . . . , 565m−1, 565m control the activation and deactivation of the Row Write Select transistors 560a, 560b, . . . , 560m−1, 560m to steer the word line current from the Row Current Source 555 through the selected write line 509a, 509b, . . . , 509m−1, 509m.

Further, each row of the MRAM memory cells 500 has a Read Word Line 570a, 570b, . . . , 570m−1, 570m connected to the gate of the isolation transistor of each of the MRAM memory cells 500. The Read Word Lines 570a, 570b, . . . , 570m−1, 570m control the activation and deactivation of the isolation transistors of each of the MRAM memory cells 500 with the selected row of the MRAM data cell sub-array being activated during a read operation to conduct the read current from the associated bit lines 507a, . . . , 507j, . . . , 507n and 508a, . . . , 508j, . . . 508n through the MTJ device of the selected MRAM memory cells 500. The reading and writing operations using the MRAM sub-array as shown will be explained hereinafter.

Figure 9:
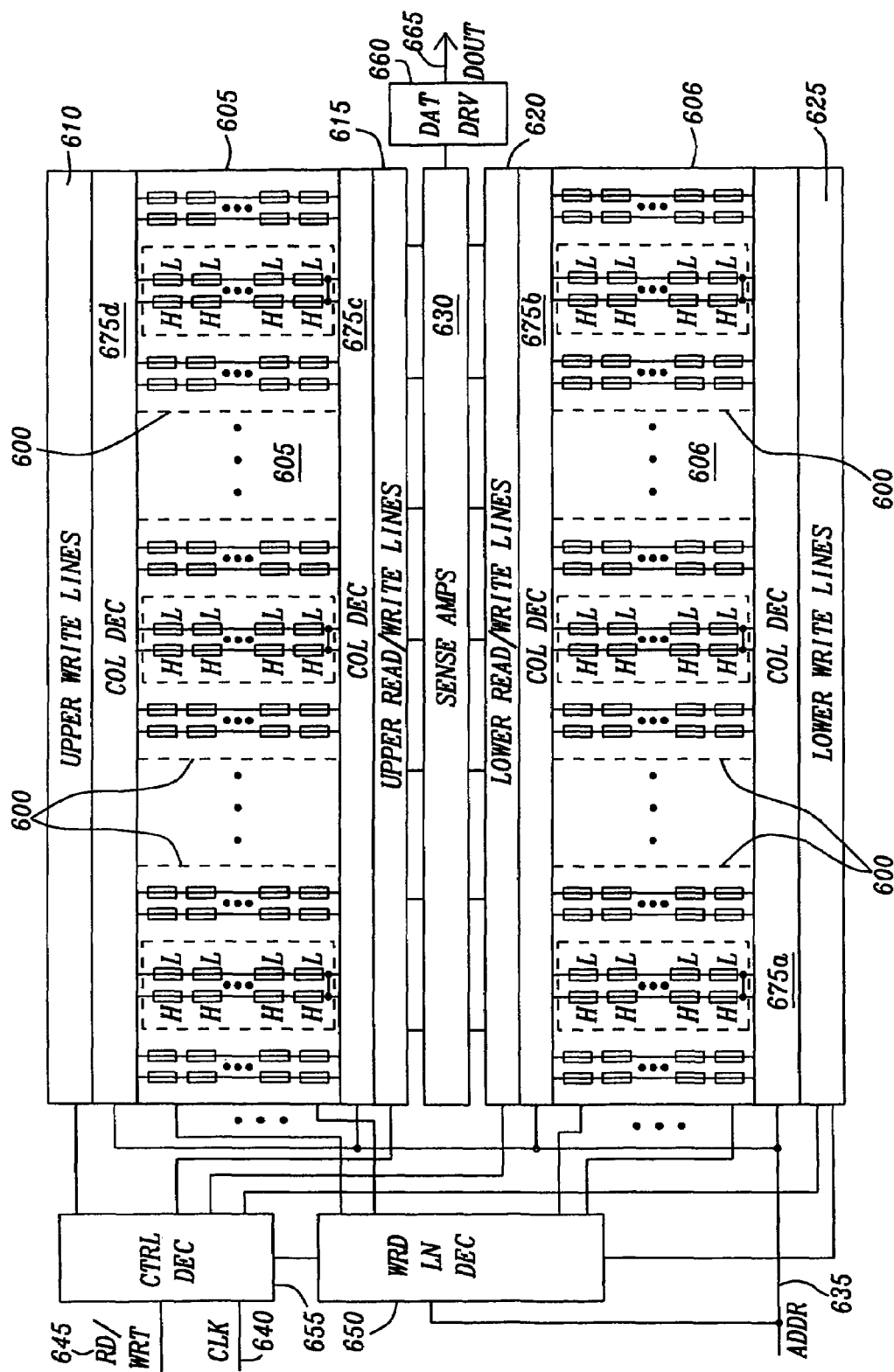
FIG. 9 is a block diagram of an MRAM array of this invention including the second embodiment of an MRAM sub-array FIG. 8.

Refer now to FIG. 9 for a discussion of the second embodiment of the MRAM array of this invention. Groups of the of the MRAM data cell sub-arrays 600 are collected together to form an upper MRAM array block 605 and a lower MRAM array block 606. As described in FIG. 8, each of the MRAM sub-arrays 600 of the upper and lower array blocks 605 and 606 has at least one column pair of MRAM reference cells placed centrally each of the within the upper and lower array blocks 605 and 606. The columns of MRAM data cells and the columns of MRAM reference cells of each MRAM sub-array of the Upper MRAM array block 605 are connected to the Upper Write Lines 610 and the Upper Read/Write Lines 615. The Upper Write Lines 610 and the Upper Read/Write Lines 615 are structured and function as described above in FIG. 8. Similarly, the MRAM data cell columns and the MRAM reference cell columns of the MRAM sub-arrays 600 of the Lower MRAM array block 606 are connected to the Lower Write Lines 625 and the Lower Read/Write Lines 620. The Lower Write Lines 625 and the Lower Read/Write Lines 620, also, are structured and function as described above in FIG. 8.

The Upper Read/Write Lines 615 and Lower Read/Write Lines 620 are connected to the sense amplifiers 630 which detect the digital data state of the selected MRAM cells of a column of data cells of a selected MRAM cell sub-array 600. The column MRAM reference cells of an MRAM cell sub-array 600 of the opposing upper or lower array blocks 605 or 606 is applied to the sense amplifier 630 to generate the reference current used to determine the digital data state of the selected MRAM cell of the selected upper or lower array blocks 605 or 606. The digital data as recovered by the sense amplifiers 630 is transferred to the data drivers 660 for transfer and the output data 665 to external circuitry. The digital data may be a single bit, or the digital data may have an eight bit, sixteen bit, or thirty-two bit digital data width.

The address bus 635 provides a digital address word that is decoded to select the location of the MRAM array containing the desired digital data. The address bus 635 is connected to the word line decoder 650 and the column decoder sections 675a, 675b, 675c, and 675d. The read/write control line 645 and the clock lines 640 provide the digital timing and control signals to the control decoder 655. The control decoder 655 provides the necessary timing and control signals to the word line decoder 650, the column decoder sections 675a, 675b, 675c, and 675d, and the upper and lower array blocks 605 and 606 to generate the signals for activating a selected MRAM cell sub-array 600 and its associated MRAM column of reference cells of the opposing MRAM cell sub-array 600 for reading the desired digital data or for writing to the selected MRAM cell sub-array 600.

Figure 10:
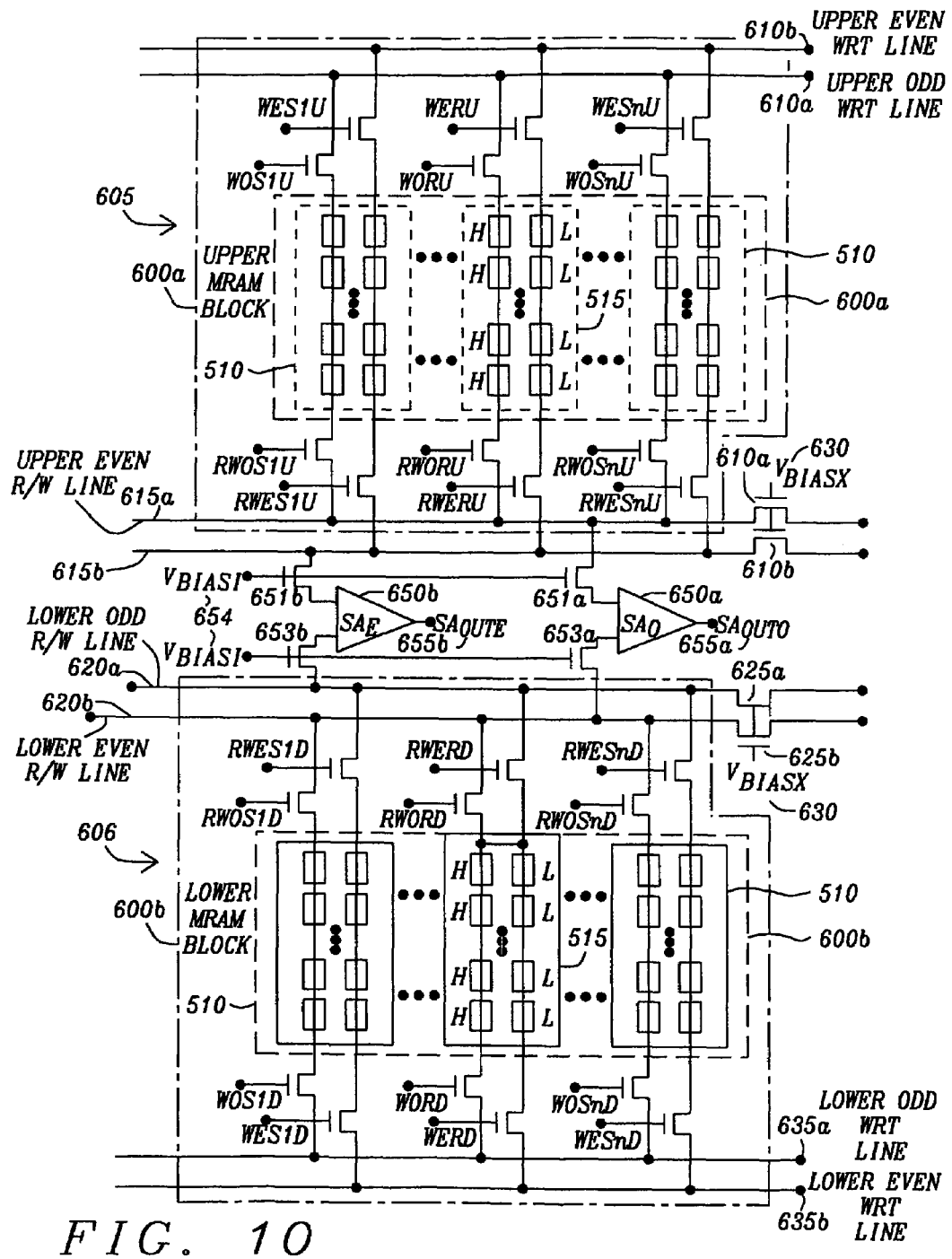
FIG. 10 is a schematic diagram of the read circuit, with a reference current generator of the second embodiment of this invention.

An example of the control and data flow for reading digital data from an upper MRAM array block 600a of FIG. 9 is shown in FIG. 10. Referring to FIGS. 8, 9 and 10, the data columns of the MRAM cell sub-array 600a from the upper MRAM array block 605 is selected for retrieving digital data. When the upper MRAM array block 605 is chosen the pair of reference cell columns of the MRAM cell sub-array 600b of the lower MRAM array block 606 is automatically associated with the selected MRAM cell sub-array 600a from the upper MRAM array block 605. The column decoder sections 675a, 675b, 675c, and 675d of FIG. 9 decode the incoming digital address word to determine the selected pair of bit lines 507a, . . . , 507n and 508a, . . . , 508n of the MRAM cell sub-array 600a from the upper MRAM array block 605 of FIG. 9. The column decoder section 675c of FIG. 9 then activates the Upper Read/Write Lines 615a and 615b associated with the selected MRAM cell sub-array 600a from the upper MRAM array block 605 and sets the Read/Write Even Data Column Select Lines 522a, . . . , 522n and Read/Write Odd Data Column Select Lines 523a, . . . , 523n to activate the Read/Write Column Select transistor 520a, . . . , 520n and 521a, . . . , 521n to connect the data column 510 of the MRAM cells of the selected MRAM data cell sub-array 600a to the Upper Read/Write Lines 615a and 615b.

The Word Line decoder 650 decodes the incoming address word 635 to determine the row of the MRAM cell sub-array 600a from which the digital data is to be read. The word line decoder 650 selectively activates the Read Word Lines 570a, 570b, . . . , 570m−1, 570m of FIG. 8 for the desired row to be read. As noted above the Read Word Lines 570a, 570b, . . . , 570m−1, 570m activate the isolation transistor of each MRAM cell on the selected row such that the current applied to the Upper Read/Write Lines 615a and 615b conducts through the MTJ of the selected MRAM cells. The Column decoder 675d deactivates the Write Odd Data Column Select Lines 537a, . . . 537n and Write Even Data Column Select Line 538a, . . . , 538n to disconnect the Upper Write Lines 610a and 610b of FIG. 10 from the bit lines of the selected MRAM cell sub-array 600a.

When the word line decoder 650 and column decoder section 675c selects the selected MRAM cell sub-array 600a, the Column Decoder section 675b selects the coupled pair of reference columns of the corresponding MRAM cell sub-array 600b in the MRAM block 606. The Read/Write Even Reference Column Select Line 524a and Read/Write Odd Reference Column Select Line 524b are activated to turn on the Read/Write Select transistors 520j and 521j to connect the bit lines of the selected column of reference cells to the Odd Read/Write line 620a and the and the Even Read/Write Line 620b to the columns of the MRAM cell sub-array 600b. The Word Line decoder 650 activates the selected Read Word Line 570a, 570b, . . . , 570m−1, 570m to turn the isolation transistor of the MRAM cells of the selected row of the MRAM cell sub-array 600b.

The first selected data column of the MRAM cell sub-array 600a and the first selected reference column of the MRAM cell sub-array 600b are respectively connected through the Upper Read/Write Line 615a and the Lower Read/Write Line 620a to the sense amplifier 650a included in the sense amplifier block 630. Similarly, the second selected data column of the MRAM cell sub-array 600a and the second selected reference column of the MRAM cell sub-array 600b are respectively connected through the Upper Read/Write Line 615b and the Lower Read/Write Line 620b to the sense amplifier 650b included in the sense amplifier block 630. The sense amplifier gating transistors 651a and 653a control the application of the voltage developed across the MTJ device of the selected MRAM cell of the data column of MRAM cells of the MRAM cell sub-array 600a and the parallel MTJ devices of the paired reference columns of MRAM cells of the MRAM cell sub-array 600b to the sense amplifier 650a. Correspondingly, the sense amplifier gating transistors 451b and 453b control the application of the voltage developed across the MTJ device of the selected MRAM cell of the data column of MRAM cells of the MRAM cell sub-array 600a and the parallel MTJ devices of the paired reference columns of MRAM cells of the MRAM cell sub-array 600b to the sense amplifier 650b.

The internal switching bias voltage $V_{BIAS1}$ 654 turns the sense amplifier gating transistors 651a, 651b, 653a, and 653b on to be in deep saturation to keep the source node voltage of the sense amplifier gating transistors 651a, 651b, 653a, and 653b at the desired biasing voltage level necessary for the MTJ devices of the MRAM cells of the MRAM cell sub-array 600a and the MRAM cell sub-array 600b. Each of the Upper Read/Write Lines 615a and 615b are respectively set by the biasing voltage levels $V_{BIAS1}$ 654 to a voltage level of approximately 400 mv to bias the MTJ device of the selected data MRAM cells and the reference MRAM cells. The biasing voltage levels causes the sense currents to flow through the bit lines of the selected data columns of the MRAM cell sub-array 600a to the selected row of the MRAM cells. The resistance of the MTJ of the selected row of MRAM cells determines the sense currents.

The Lower Read/Write Lines 620a and 620b are respectively set to the reference biasing voltage levels. The reference biasing voltage levels causes the reference currents to flow through the bit lines of the reference columns of the MRAM cell sub-array 600b to the selected row of the MRAM cells. The resistance of the MTJ of the selected row of MRAM cells determines the reference currents.

Assuming MTJ devices of the first reference column of the pair of columns of the MRAM cell sub-array 600b are programmed to have the free magnetic layer have an opposing magnetic orientation to the fixed magnetic and thus have a higher resistance and the MTJ devices of the second reference column of the pair of columns of the MRAM cell sub-array 600b are programmed to have the free magnetic layer have an aligned magnetic orientation to the fixed magnetic and thus have a lower resistance, the current of the first reference column has a lower magnitude than the current of the second reference column. The coupling 580 of the paired reference columns of the MRAM cell sub-array 600b causes the reference currents to be essentially one half of the sum of the currents or the average of the two currents.

The reference currents act as the reference input currents for the sense amplifiers 650a and 650b. The sense currents are respectively applied to the sense amplifiers 650a and 650b. The sense amplifiers 650a and 650b are differential transresistance amplifiers that compare the sense currents with the reference currents to determine the digital data state of data MRAM cells at the outputs 655a and 655b of the sense amplifiers 650a and 650b.

The Upper Read/Write Lines 615a and 615b are disconnected from external circuitry by Read/Write gating transistors 610a and 610b and the Lower Read/Write Lines 620a and 620b are disconnected from external circuitry by Read/Write gating transistors 625a and 625b. The function of the Read/Write gating transistors 620a, 620b, 625a and 625b is explained hereinafter.

Figure 11:
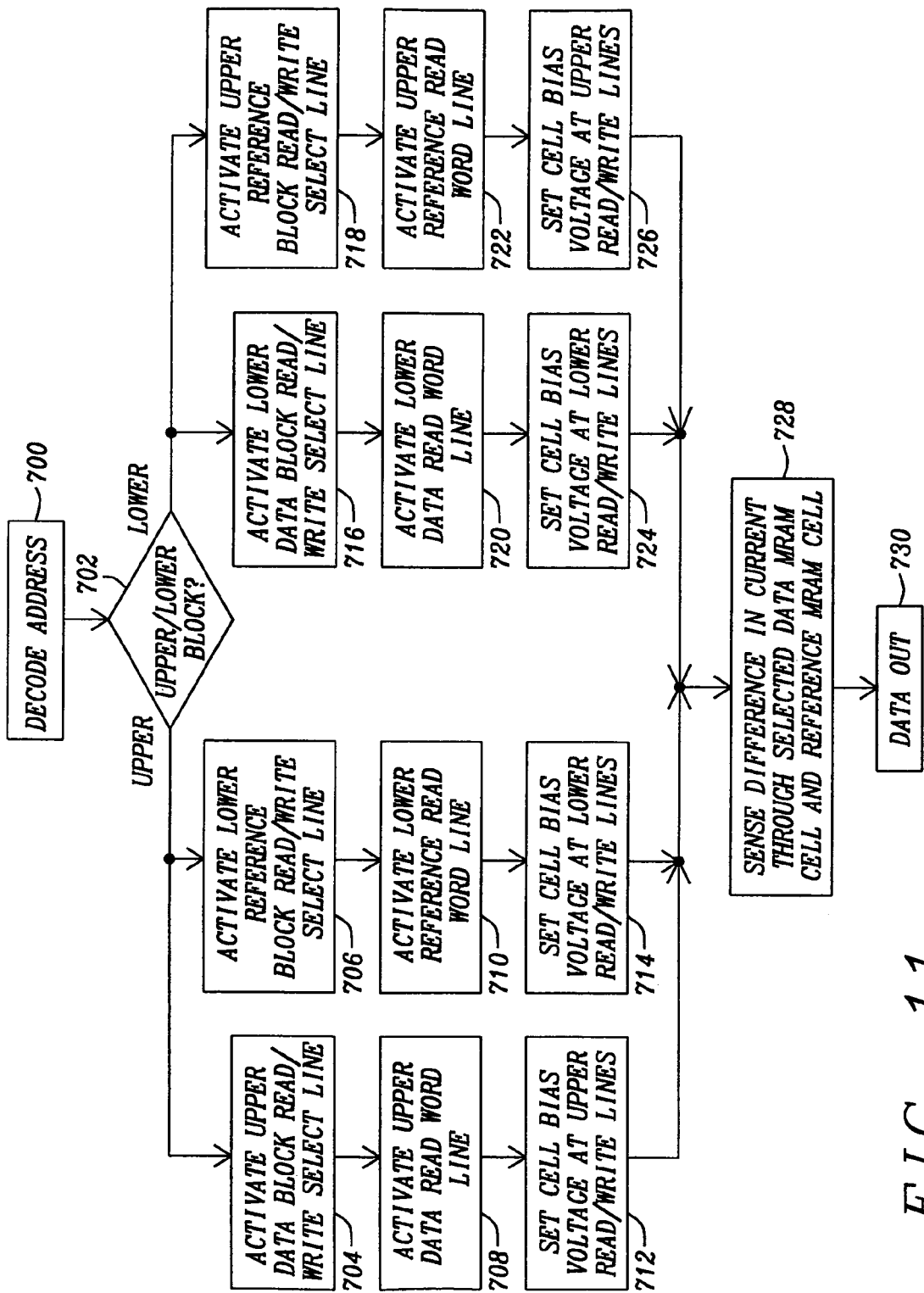
FIG. 11 is a flowchart of the method for reading an MRAM array of this invention.

Refer now to FIG. 11 for a discussion of reading of selected MRAM cells within the MRAM array of FIG. 6. An Address is decoded (Box 700). The selected location is determined (Box 702). If the selected MRAM cells are in the upper block of MRAM sub-arrays, the Upper Data Block Read/Write Select Lines are activated (Box 704) to connect the selected data MRAM sub-array to the sense amplifiers. Simultaneously, the Lower Reference Block Read/Write Select Lines are activated (Box 706) to connect the Reference MRAM sub-array to the sense amplifiers. The Upper and Lower Block Write Select Lines are all deactivated for the process of reading selected MRAM cells. The Upper Data Read Word Line for the row of the selected MRAM cells are activated (Box 708) to turn on the isolation transistor of the row of selected data MRAM cells of the selected sub-array of MRAM cells. The Lower Reference Read Word Line for the row of the Reference MRAM cells associated with the row of selected MRAM cells of the upper sub-array of MRAM cells are activated (Box 710) to turn on the isolation transistor of the row of selected reference MRAM cells of the selected reference sub-array of MRAM cells. It should be noted that Reference Read Word Line and Data Read Word Line are same line (Read Word Line 265a, 265b, . . . , 265m−1, 265m of FIG. 5).

The cell bias for the Upper Read/Write Lines is set (Box 712) to bias the MTJ device of the selected data MRAM cells and the cell bias for the Lower Read/Write Lines is set (Box 714) to bias the MTJ device of the selected reference MRAM cells. The sense amplifiers then sense (Box 728) the differences in the current between the selected Data MRAM cells and the associated Reference MRAM cells. The sense amplifiers are amplifiers that provide a voltage output (Box 730) that is representative of the digital data state of the selected DATA MRAM cells.

If the selected MRAM cells are in the lower sub-array of MRAM sub-arrays, the Lower Data Block Read/Write Select Lines are activated (Box 716) to connect the selected data MRAM sub-array to the sense amplifiers. Simultaneously, the Upper Reference Block Read/Write Select Lines are activated (Box 718) to connect the Reference MRAM sub-array to the sense amplifiers. It should be noted that Reference Read Word Line and Data Read Word Line are same line (Read Word Line 265a, 265b, . . . , 265m–1, 265m of FIG. 5). The Upper and Lower Block Write Select Lines are all deactivated for the process of reading selected MRAM cells. The Lower Data Read Word Line for the row of the selected MRAM cells are activated (Box 720) to turn on the isolation transistor of the row of selected data MRAM cells of the selected sub-array of MRAM cells. The Upper Reference Read Word Line for the row of the Reference MRAM cells associated with the row of selected MRAM cells of the Lower sub-array of MRAM cells are activated (Box 722) to turn on the isolation transistor of the row of selected reference MRAM cells of the selected reference sub-array of MRAM cells.

The cell bias for the Lower Read/Write Lines is set (Box 724) to bias the MTJ device of the selected data MRAM cells and the cell bias for the Upper Read/Write Lines is set (Box 726) to bias the MTJ device of the selected reference MRAM cells. The sense amplifiers then sense (Box 728) the differences in the current between the selected Data MRAM cells and the associated Reference MRAM cells. As described above, the sense amplifiers are amplifiers that provide a voltage output (Box 730) that is representative of the digital data state of the selected DATA MRAM cells.

Figure 12:
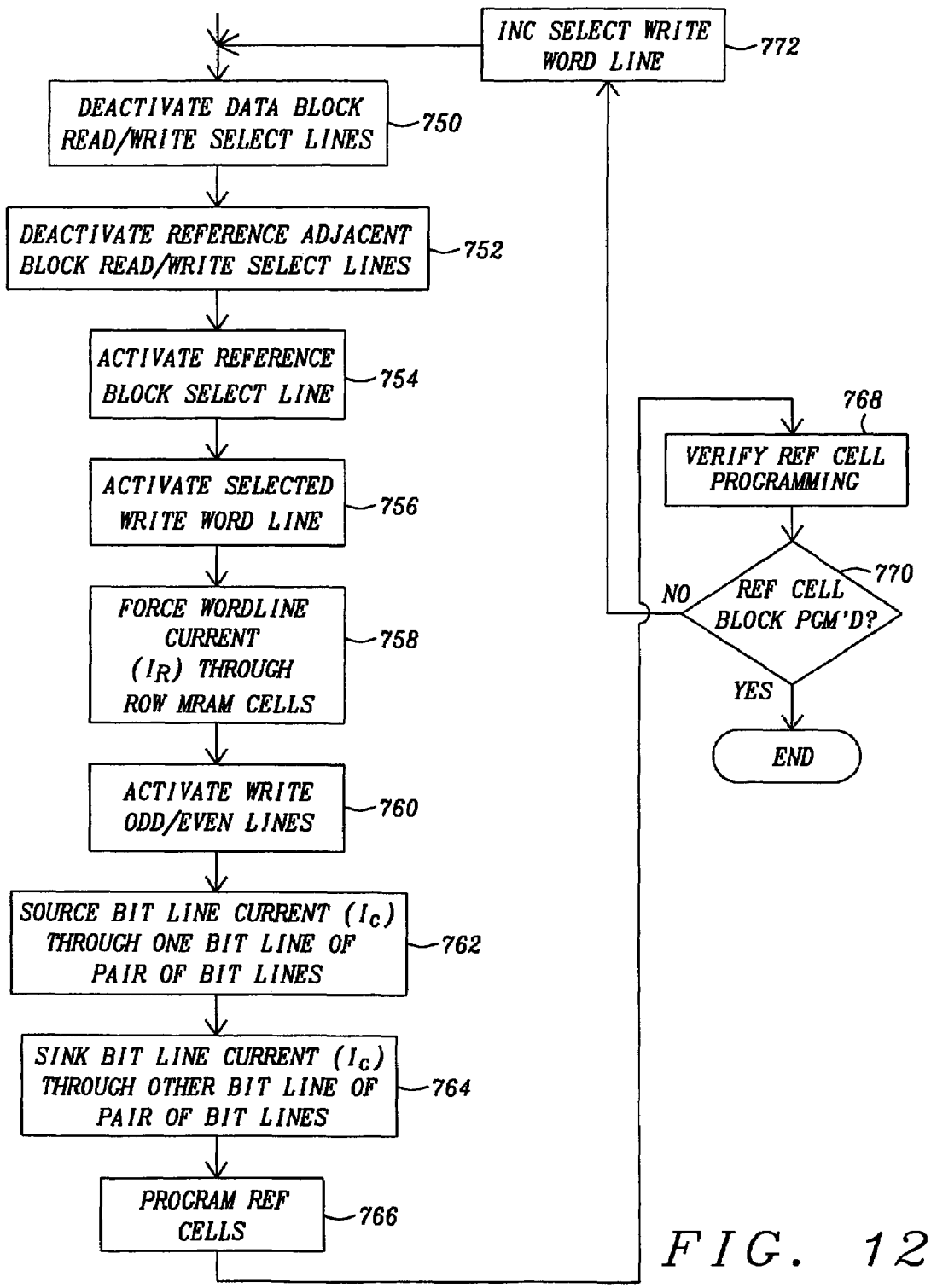
FIG. 12 is a flowchart of the method for programming MRAM reference cell block of the MRAM array of this invention.

The sub-array of reference MRAM cells described in FIG. 5 is programmed after the completion of the fabrication process and during the manufacturing testing process. Refer to FIG. 12 for a discussion of a first embodiment of the method for programming reference MRAM cells and verifying that the reference MRAM cells are correctly programmed. The Data Block Read/Write Select Lines for all the data MRAM sub-arrays of the upper and lower blocks of sub-arrays are deactivated (Box 750). The Reference Block Read/Write Select Lines for all the reference MRAM sub-arrays of the upper and lower blocks of sub-arrays are similarly deactivated (Box 752). The Reference Block Select Lines and selected Write Word Lines are activated (Boxes 754 and 756). The Word Line current is forced (Box 758) through the selected row of the reference MRAM cells to program the selected row of the reference MRAM cells. The Write Odd and Write Even Select Lines are activated (Box 760). One reference bit line of each coupled pair of the reference bit lines has the bit line current sourced (Box 762) through it and transferred through the coupling to the second reference bit line of the coupled pair. The bit line current is then sunk (Box 764) through the second bit line of the coupled pair.

The bit line current and the word line current flow in directions that causes a magnetic orientation that sets the magnetic orientation of the free magnetic layer of the selected MRAM cells adjoined to the one reference bit line of each coupled pair of reference bit lines to be aligned with the fixed magnetic layer causing the MRAM cells to have a lower resistance. The bit line current and the word line current flow conversely set the magnetic orientation of the free magnetic layer MRAM cells adjoined to the second bit line of the coupled bit lines to be opposing the orientation of the fixed magnetic layer and thus have higher resistance.

The currents are through each of the Write Word Lines and the Reference bit lines are maintained until the reference MRAM cells are programmed (Box 766). The reference cells are verified (Box 768) for programming and tested (Box 770) for completion of programming. If the reference block has not completed programming, the Write Word Lines are incremented (Box 772) to select each row of the reference MRAM cells in sequence such that each row of reference MRAM cells is programmed. If all the MRAM cells in the reference sub-array are programmed the process is ended.

Figure 13:
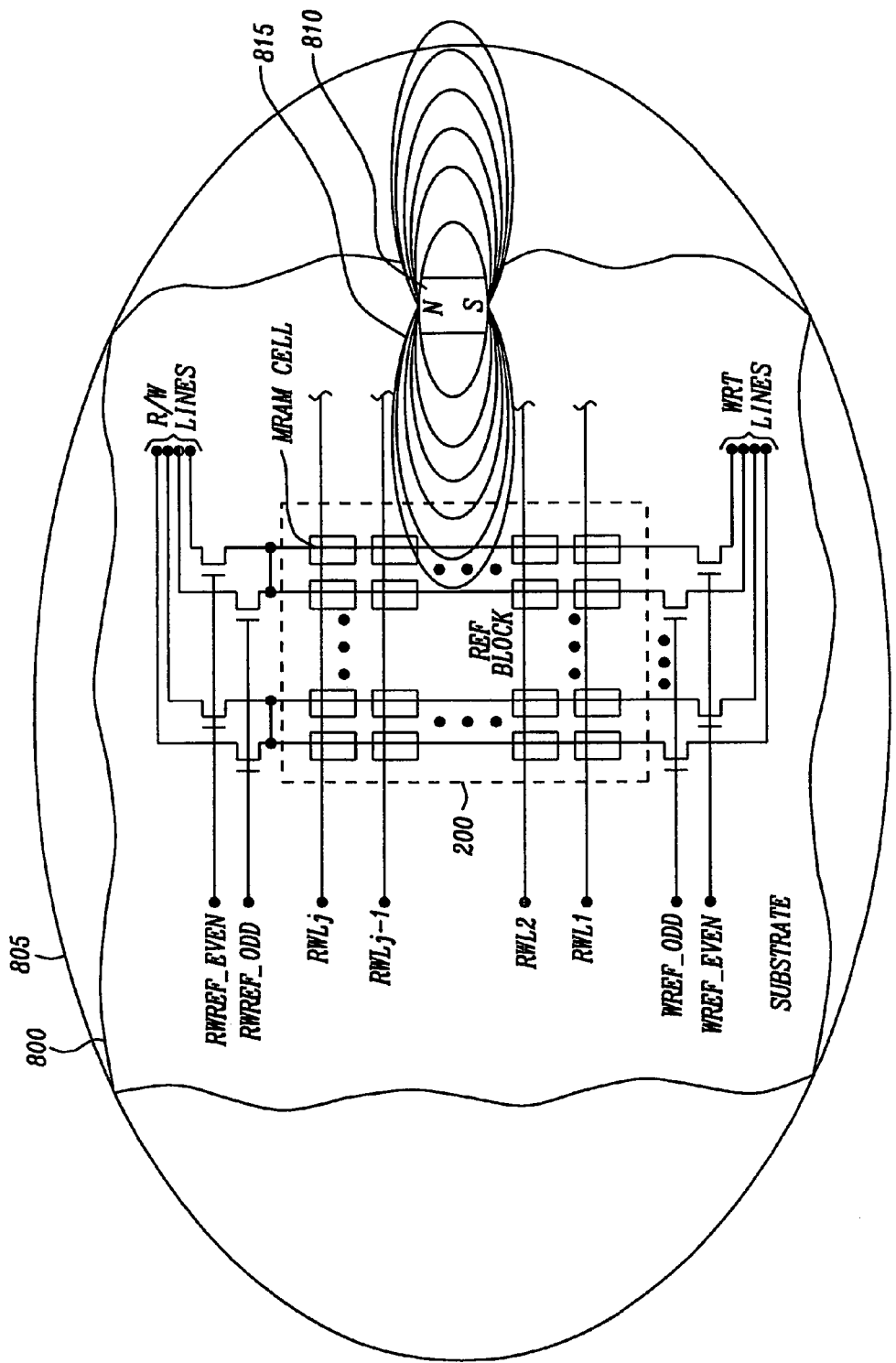
FIG. 13 is a diagram for programming the MRAM reference cell using a magnetic field of this invention.

Since programming of the sub-arrays of the reference MRAM cells, occurs only at the time of the manufacturing testing process of an MRAM array, an external field may be used for programming the reference MRAM cells. Refer to FIG. 13 for a discussion of a second embodiment for an apparatus and method for programming of reference MRAM cells of this invention. The method is as described in FIG. 12 except forcing (Box 758) the Word Line current through the selected row of the reference MRAM cells to program the selected row of the reference MRAM cells is replaced by the placing a controllable magnetic field generator 810 to provide a magnetic field 815 that is oriented and placed at a calibrated distance from the MRAM array to program the magnetic layer with the desired magnetic orientation. With the external magnetic field 815, a single cycle of sourcing (Box 762) the bit line current to one bit line of the bit line pair, transferring the bit line current through the coupling and sinking (Box 764) the bit line current through the second bit line of the coupled pair is required for programming (Box 766) the reference MRAM cells connected to the coupled pair of bit lines.

The controllable field generator 810 provides one implementation of providing an external field 815. An external magnetic field or fields may be provided in various ways to aid or impede fields generated by the Word Line current and the Bit Line current.

Figure 14:
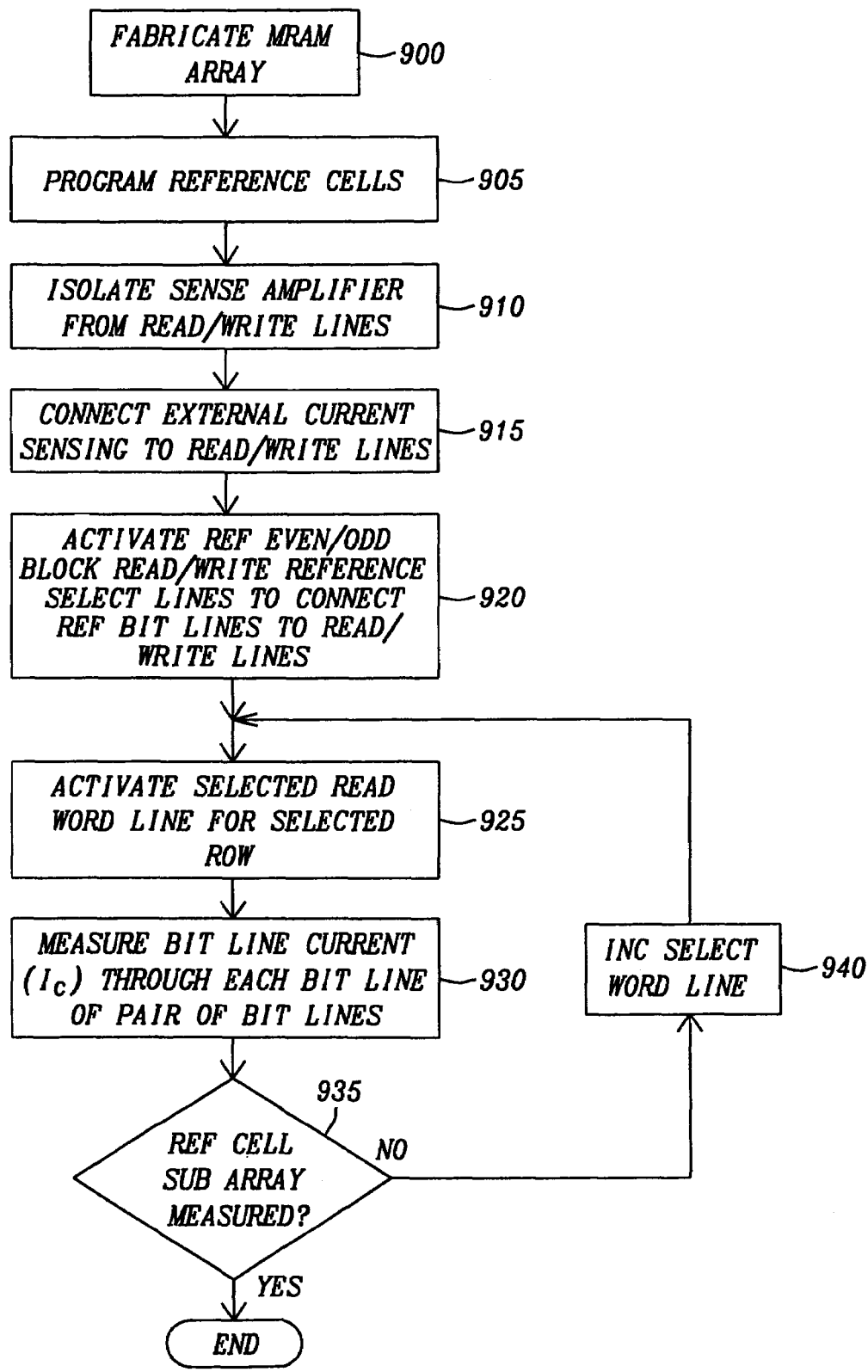
FIG. 14 is a flowchart of the method for verifying programming of the MRAM reference cells of this invention.

Refer to FIGS. 7a and 14 for a discussion of the verification programming of the MRAM reference cells of the MRAM reference cell sub-arrays 200 as shown in Box 768 of FIG. 12. The MRAM array is fabricated (Box 900) on a substrate and the reference MRAM cells of the MRAM reference cell sub-array 200 are programmed (Box 905) as described for FIG. 12 or FIG. 13. The sense amplifiers 400a and 400b are isolated (Box 910) from the Upper Read/Write Lines 315 and Lower Read/Write Lines 320 via the External Connection gating transistors 409a, 409b, 409c, and 409d by deactivating the internal switching bias voltage $V_{BIASI}$ 412 to turn off the sense amplifier gating transistors 405a, 405b, 407a, and 407b. An external current sensing device is connected (Box 915) to each of the Upper Read/Write Lines 315 and Lower Read/Write Lines 320 for measuring the current in each of the bit lines adjoined to the columns of MRAM cells of the MRAM reference cell sub-array 200. The external switching bias voltage $V_{BIASX}$ 410 is activated to turn on the External Connection gating transistors 409a, 409b, 409c, and 409d. The Even and Odd Block Read/Write Reference Select Line 220 and 222 are activated (Box 920) to turn on the Block Read/Write Select transistors 211a, . . . , 211n and 212a, . . . , 212n to connect the bit lines of the bit lines adjoined to the columns of MRAM cells of the MRAM reference cell sub-array 200 to the Lower Read/Write Lines 320 (in this example).

One of the Read Word Lines 265a, 265b, . . . , 265m–1, 265m connected to the gate of the isolation transistor of each of the rows of the MRAM memory cells of the MRAM reference cell sub-array 200 is selected activated (Box 925) for a selected row to turn on the isolation transistor. The external switching bias voltage $V_{BIASX}$ 410 sets the Upper Read/Write Lines 315 and Lower Read/Write Lines 320 to a voltage level (approx. 400 mv) sufficient to bias the MTJ devices of the MRAM cells of the MRAM reference cell sub-array 200. The external current sensing device measures (Box 930) the current flowing through the selected MRAM cell of each bit line of the MRAM reference cell sub-array 200. Since the columns of the MRAM reference cell sub-array 200 are pair-wise connected by the coupling 270, the measured reference currents on each of the Lower Read/Write Lines 320 are essentially one half of the sum of the currents or the average of the two currents of the columns.

The address of the Read Word Lines 265a, 265b, . . . , 265m−1, 265m is examined (Box 935) to determine if all rows of the MRAM reference cell sub-array 200 are completed. The address is incremented (Box 940) to select the next Read Word Line 265a, 265b, . . . , 265m−1, 265m for measuring the currents of the next row of MRAM cells of the MRAM reference cell sub-array 200. When all the rows are measured, the measurements are evaluated to determine if the MRAM cells of the MRAM reference cell sub-array 200 are programmed.

While this invention has been particularly shown and described with reference to the preferred embodiments thereof, it will be understood by those skilled in the art that various changes in form and details may be made without departing from the spirit and scope of the invention.

The invention claimed is:

1. An MRAM reference cell sub-array programming apparatus comprising:
a fixture for retaining a substrate onto which a substrate comprising a plurality of MRAM reference cell sub-arrays in communication with a plurality of sense amplifiers formed on said substrate, said plurality of MRAM reference cell sub-arrays comprising:
a plurality of MRAM cells arranged in rows and columns;
a plurality of bit lines, each bit line associated with a free magnetic layer of each MRAM cell of a column of the plurality of MRAM cells, and
a coupling to connect the bit lines of pairs of the columns of the plurality of MRAM cells together;
a control apparatus in communication with said plurality of MRAM reference cell sub-arrays for isolating said plurality of MRAM reference cell sub-arrays from said plurality of sense amplifiers;
a magnetic field generation device placed in near proximity to generate a magnetic field having an orientation to a desired magnetic orientation of said plurality MRAM cells; and
a free layer programming device for conveying a free layer programming current in a first direction on each bit lines of the first column of the pairs of columns of MRAM cells to be transferred through said coupling to each bit line of the second column of the pairs of columns of MRAM cells;
wherein a pair of the MRAM cells of said pair of columns are on a common row of said MRAM cells and a first of said pair of MRAM cells is programmed to a first magneto-resistive state and a second of said pair of MRAM cells is programmed to a second magneto-resistive state such that when one row of MRAM cells are selected for read, said pair of MRAM cells are placed in parallel to generate said mid-point reference current.

2. The MRAM reference cell sub-array programming apparatus of claim 1 further comprising:
a write word line current generator for conveying a write word line current generator in a second direction on selected word lines associated with rows of said MRAM cells.

3. The MRAM reference cell sub-array programming apparatus of claim 1 wherein at the completion of the programming of each of the plurality of MRAM reference cell sub-arrays, the free layer programming device terminates the free layer programming current and the control device reconnects each of the plurality sense amplifiers to communicate with each its associated column of plurality of MRAM reference cell sub-arrays.

4. The MRAM reference cell sub-array programming apparatus of claim 2 wherein at the completion of the programming of each of the plurality of MRAM reference cell sub-arrays, the free layer programming device terminates the free layer programming current, the write word line current generator terminates the write word line current, and the control device reconnects each of the plurality sense amplifiers to communicate with each its associated column of plurality of MRAM reference cell sub-arrays.

5. A method for programming reference MRAM cells within a sub-array of rows and columns of MRAM cells, comprising the steps of:
providing a substrate;
forming a plurality of MRAM reference cell sub-arrays in communication with a plurality of sense amplifiers formed on said substrate, said forming the plurality of MRAM reference cell sub-arrays comprising the steps of:
forming a plurality of MRAM cells to be arranged in rows and columns;
forming a plurality of bit lines such that each bit line is associated with a free magnetic layer of each MRAM cell of a column of the plurality of MRAM cells, and
forming a coupling to connect the bit lines of pairs of the columns of the plurality of MRAM cells together;
retaining said substrate on a fixture;
isolating selected columns of MRAM cells from associated sense amplifiers;
selecting a pair of the MRAM cells on one pair of columns on a common row of said MRAM cells;
programming a first of said pair of MRAM cells to a first magneto-resistive state and a second of said pair of MRAM cells to a second magneto-resistive state;
reading one row of MRAM cells by placing said pair of MRAM cells in parallel to generate said mid-point reference current;
wherein programming the first of said pair and the second of said pair of MRAM cells comprises the steps of:
generating a magnetic field having a desired magnetic orientation to program free magnetic layers of said selected pair of the MRAM cells,
placing said magnetic field in near proximity to said substrate to program selected pair of the MRAM cells, and
conveying a free layer programming current on each bit line of said selected pair of the MRAM cells to program the free magnetic layers of said selected MRAM cells.

6. The method for programming reference MRAM cells of claim 5 further comprising the step of:
conveying a write word line programming current on each word line associated with a row of said selected pair of the MRAM cells to program the free magnetic layers of said selected pair of the MRAM cells.

7. The method for programming reference MRAM cells of claim 5 further comprising the step of:
   at the completion of the programming of each of said selected pair of the MRAM cells, terminating the free layer programming current; and
   reconnecting each of the plurality sense amplifiers to communicate with each bit line of each column of said selected pair of the MRAM cells.

8. The method for programming reference MRAM cells of claim 6 further comprising the step of:
   at the completion of the programming of each of said selected pair of the MRAM cells, terminating the free layer programming current;
   terminating said write word line programming current; and
   reconnecting each of the plurality sense amplifiers to communicate with each bit line of each column of said selected pair of the MRAM cells.

* * * * *